(12) United States Patent
Gorman et al.

(10) Patent No.: US 7,816,665 B2
(45) Date of Patent: Oct. 19, 2010

(54) USE OF ELECTROACTIVE MONOLAYERS IN GENERATING NEGATIVE DIFFERENTIAL RESISTANCE BEHAVIORS AND DEVICES EMPLOYING THE SAME

(75) Inventors: Christopher B. Gorman, Cary, NC (US); Richard Lloyd Carroll, Cary, NC (US); Grace Credo, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 945 days.

(21) Appl. No.: 10/502,872

(22) PCT Filed: Feb. 27, 2003

(86) PCT No.: PCT/US03/06095

§ 371 (c)(1),
(2), (4) Date: Apr. 4, 2005

(87) PCT Pub. No.: WO03/073513

PCT Pub. Date: Sep. 4, 2003

(65) Prior Publication Data

US 2005/0253139 A1  Nov. 17, 2005

Related U.S. Application Data

(60) Provisional application No. 60/359,946, filed on Feb. 27, 2002.

(51) Int. Cl.
*H01L 29/06* (2006.01)
(52) U.S. Cl. .............. 257/40; 257/46; 438/99; 977/702; 977/703; 977/705; 977/720; 977/755
(58) Field of Classification Search .......... 257/40, 257/46; 438/99; 977/702–707, 720, 755
See application file for complete search history.

(56) References Cited

U.S. PATENT DOCUMENTS

| 6,204,513 | B1 | 3/2001 | El-Zein et al. |
| 6,320,200 | B1 | 11/2001 | Reed et al. |
| 6,430,511 | B1 * | 8/2002 | Tour et al. ............ 702/19 |
| 6,512,119 | B2 | 1/2003 | Bratkovski et al. |
| 6,551,495 | B1 | 4/2003 | Porter et al. |
| 2003/0143581 | A1 * | 7/2003 | Franzen et al. ......... 435/6 |

FOREIGN PATENT DOCUMENTS

WO   WO03/073513   9/2003

OTHER PUBLICATIONS

Broekaert, et al., A Monolithic 4-Bit 2-Gsps Resonant Tunneling Analog-to-Digitial Converter. *IEEE Journal of Solid-State Circuits*. vol. 33, No. 9 pp. 1342-1349 (1998).

(Continued)

*Primary Examiner*—Bradley K Smith
*Assistant Examiner*—Jami M Valentine
(74) *Attorney, Agent, or Firm*—Jenkins, Wilson, Taylor & Hunt, P.A.

(57) ABSTRACT

A negative differential resistance (NDR) device, and methods of making and using the NDR device. The NDR device includes a substrate comprising a conductor material or a semi-conductor material and a self-assembled monolayer (SAM) that includes a first electroactive moiety and a spacer moiety disposed on the substrate that defines a barrier between the electroactive moiety and the substrate, wherein the NDR device exhibits negative differential resistance in the presence of a varying applied voltage. Also provided are NDR in multilayers in which the peak to valley ratio of the NDR response can be controlled by the number of layers; modulation of NDR using binding groups to one of the electrical contacts or to the electroactive moiety itself; and NDR devices that display multiple peaks in the current-voltage curve that contain electroactive moieties that have multiple low potential electrochemical oxidations and/or reductions.

84 Claims, 16 Drawing Sheets

OTHER PUBLICATIONS

Brown, J.L., and Pohm, A.V., 1-Mb Memory Chip Using Giant Magnetoresistive Memory Cells. *IEEE Transactions on Components, Packaging, and Manufacturing Technology—Part A*. vol. 17, No. 3 pp. 373-379 (1994).

Chen, et al., Large On-Off Ratios and Negative Differential Resistance in a Molecular Electronic Device. *Science*. vol. 286 pp. 1550-1552 (1999).

Chen, et al., Room-temperature negative differential resistance in nanoscale molecular junctions. *Applied Physics Letters*. vol. 77, No. 8 pp. 1224-1226 (2000).

Cornil, et al., Negative Differential Resistance in Phenylene Ethynylene Oligomers. *Journal of the American Chemical Society*. vol. 124, No. 14 pp. 3516-3517 (2002).

Gaudioso, et al., Vibrationally Mediated Negative Differential Resistance in a Single Molecule. *Physical Review Letters*. vol. 85, No. 9 pp. 1918-1921 (2000).

Gorman et al., Negative Differential Resistance in Patterned Electroactive Self-Assembled Monolayers. *Langmuir*. vol. 17, No. 22 pp. 6923-6930 (2001).

Gorman, et al., Scanning Probe Lithography to form Nanoscale Patterned Surfaces. ACS Meeting Slides. Apr. 1, 2001.

Holmlin, et al., Electron Transport through Thin Organic Films in Metal-Insulator-Metal Junctions Based on Self-Assembled Monolayers. *Journal of the American Chemical Society*. vol. 123, No. 21 pp. 5075-5085 (2001).

Huang, et al., New method of modelling a multipeak resonant tunnelling diode. *Electronics Letters*. vol. 30, No. 12 pp. 1012-1013 (1994).

Isnin, et al., Bimodal Cyclodextrin Complexation of Ferrocene Derivatives Containing n-Alkyl Chains of Varying Length. *Journal of Organic Chemistry*. vol. 56 pp. 35-41 (1991).

Ju, H., and Leech, D., Host-Guest Interaction at a Self-Assembled Monolayer/Solution Interface: An Electrochemical Analysis of the Inclusion of 11Ferrocenylcarbonyloxy)undecanethiol by Cyclodextrins. *Langmuir*. vol. 14 pp. 300-306 (1998).

Kaba, et al., Investigation of framework and cation substitutions in Keggin-type heteropoly acids probed by scanning tunneling microscopy and tunneling spectroscopy. *Journal of Vacuum Science Technology*. vol. 15, No. 3 pp. 1299-1304 (1997).

Kinne, M., and Barteau, M.A., STM and TS investigations of silver polyoxometalate monolayers: model compounds and potential multifunctional oxidation catalysts. *Surface Science*. vol. 447 pp. 105-111 (2000).

Leonard, F. and Tersoff, J., Negative Differential Resistance in Nanotube Devices. *Physical Review Letters*. vol. 85, No. 22 pp. 4767-4770 (2000).

Mathews, et al., A New RTD-FET Logic Family. *Proceedings of the IEEE*. vol. 87, No. 4 pp. 596-605.

Matsue, et al., Electron-Transfer Reactions Associated with Host-Guest Complexation. Oxidation of Ferrocenecarboxylic Acid in the Presence of b-Cyclodextrin. *Journal of the American Chemical Society*. vol. 107 pp. 3411-3417 (1985).

McCormack, et al., Cyclic Voltammetry of Ferrocene Carboxylic Acid Cyclodextrin Inclusion Complexes. *Electrochimica Acta*. vol. 37, No. 11 pp. 1939-1944 (1992).

Schulman, et al., Physics-Based RTD Current-Voltage Equation. *IEEE Electron Device Letters*. vol. 17, No. 5 pp. 220-222 (1996).

Seabaugh, et al., Silicon-Based Tunnel Diodes and Integrated Circuits. In $4^{th}$ International Workshop of Quantum Functional Devices; Research and Development Association for Future Electron Devices: Japan. pp. 5-8 (2000).

Sun, et al., Resonant Tunneling Diodes: Models and Properties. *Proceedings of the IEEE*. vol. 86, No. 4 pp. 641-661 (1998).

Suzuki, et al., Ferrocene-Appended Cyclodextrins. The Effects of Temperature, Organic Solvent, Length of Spacer, and Cavity Size on the Complexation Behavior. *Bull. Chem. Soc. Japan*. vol. 66, No. 5 pp. 1472-1481 (1993).

Sze, S.M., Physics of Semiconductor Devices; $2^{nd}$ Ed. John Wiley and Sons: New York 1981. pp. 513-536.

Szejtli, J., Introduction and General Overview of Cyclodextrin Chemistry. *Chemical Reviews*. vol. 98, No. 5 pp. 1743-1753 (1998).

Tao, N.J., Probing Potential-Tuned Resonant Tunneling though Redox Molecules with Scanning Tunneling Microscopy. *Physical Review Letters*. vol. 76, No. 21 pp. 4066-4069 (1996).

van der Wagt, et al., RTD/HFET Low Standby Power SRAM Gain Cell. *IEEE Electron Device Letters*. vol. 19, No. 1 pp. 7-9 (1998).

Watanabe, et al., Monolithic Integration of InGaAs/InAIAs Resonant Tunneling Diode and HEMT for Single-Transistor Cell SRAM Application. *Tech. Dig. IEDM*. vol. 92 pp. 475-478 (1992).

Williamson, et al., 12 GHz Clocked Operation of Ultralow Power Interband Resonant Tunneling Diode Pipelined Logic Gates. *IEEE Journal of Solid-State Circuits*. vol. 32, No. 2 pp. 222-231 (1997).

Wold, D.J., and Frisbie, C. D., Fabrication and Characterization of Metal-Molecule-Metal Junctions by Conducting Probe Atomic Force Microscopy. *Journal of the American Chemical Society*. vol. 123 pp. 5549-5556 (2001).

Wold, D.J., and Frisbie, C.D., Formation of Metal-Molecule-Metal Tunnel Junctions: Microcontacts to Alkanethiol Monolayers with a Conducting AFM Tip. *Journal of the American Chemical Society*. vol. 122 pp. 2970-2971 (2000).

Xue, et al., Charge transfer and "band lineup" in molecular electronic devices: A chemical and numerical interpretation. *Journal of Chemical Physics*. vol. 115, No. 9 pp. 4292-4299 (2001).

Xue, et al., Negative differenential resistance in the scanning-tunneling spectroscopy of organic molecules. *Physical Review B*. vol. 59, No. 12 pp. R7852-7855 (1999).

Zeng, et al., Negative differential-resistance device involving two $C_{60}$ molecules. *Applied Physics Letters*. vol. 77, No. 22 pp. 3595-3597 (2000).

Zhao, et al., Equivalent Circuit Parameters of Resonant Tunneling Diodes Extracted from Self-Consistent Wigner-Poisson Simulation. *IEEE Transactions on Electron Devices*. vol. 48, No. 4 pp. 614-627 (2001).

Zhao, et al., Simulation of resonant tunneling structures: Origin of the I-V hysteresis and plateau-like structure. *Journal of Applied Physics*. vol. 87, No. 3 pp. 1337-1349 (2000).

Notification of Transmittal of International Preliminary Examination Report corresponding to International Patent Application No. PCT/US03/06095 dated Jan. 9, 2004.

Notification of Transmittal of the International Search Report or the Declaration corresponding to International Patent Application No. PCT/US03/06095 dated Jul. 3, 2003.

Switzer et al., *Negative Differential Resistance in Electochemically Self-Assembled Layered Nanostructures.* The Journal of Physical Chemistry B. vol. 103, No. 3 pp.:395-398 (1999).

Zhou et al., *Modulated Chemical Doping of Individual Carbon Nanotubes.* Science. vol. 290 pp. 1552-1555 (2000).

Borgstrom et al., "High peak-to-valley ratios observed in InAs/InP resonant tunneling quantum dot stacks," Applied Physics Letters. vol. 78, No. 21 pp. 3232-3234 (2001).

Bumm et al., "Directed Self-Assembly to Create Molecular Terraces with Molecularly Sharp Boundaries in Organic Monolayers," Journal of the American Chemical Society. vol. 121, No. 35 pp. 8017-8021 (1999).

Han et al., "STM Contrast, Electron-Transfer Chemistry, and Conduction in Molecules," The Journal of Physical Chemistry B. vol. 101, No. 50 pp. 10719-10725 (1997).

Dunbar et al., "Combined Scanning Tunneling Microscopy and Infrared Spectroscopic Characterization of Mixed Surface Assemblies of Linear Conjugated Guest Molecules in Host Alkanethiolate Monolayers on Gold," The Journal of Physical Chemistry B. vol. 104 pgs. 4880-4893 (2000).

Gorman et al., "Chemically Well-Defined Lithography Using Self-Assembled Monolayers and Scanning Tunneling Microscopy in Nonpolar Organothiol Solutions," Langmuir. vol. 16 pp. 6312-6316 (2000).

Karazi et al., "Negative Differential Resistance Behavior in Conjugated Molecular Wires Incorporating Spacers: A Quantum-Chemical Description," Journal of the American Chemical Society. vol. 123, No. 41 pp. 10076-10084 (2001).

Kolb, "Electrochemical Surface Science," Angewandt Chemie International Edition. vol. 40 pp. 1163-1181 (2001).

Mizuta, H., and Tomonori, T., "The Physics and Applications of Resonant Tunneling Diodes," Cambridge Studies in Semiconductor Physics and Microelectronic Engineering; Cambridge University Press, 1995.

Ross et al., "Scanning Probe Lithography. 1. Scanning Tunneling Microscope Induced Lithography of Self-Assembled n-Alkanethiol Monolayer Resists," Langmuir. vol. 9 pp. 632-636 (1993).

Roth et al., "Molecular approach toward information storage based on the redox properties of porphyrins in self-assembled monolayers," The Journal of Vacuum Science and Technology B. vol. 18, No. 5 pp. 2359-2364 (2000).

Sagara, T., and Midorikawa, T., "Electrochemical and Spectroelectrochemical Study of a Bis(arylgalvinol)-Substituted Alkyl Disulfide Monolayer and Mixed Monolayers on Polycrystalline Gold," Langmuir. vol. 14 pp. 3682-3690 (1998).

Schoer et al., "Scanning Probe Lithography. 3. Nanometer-Scale Electrochemical Patterning of Au and Organic Resists in the Absence of Intentionally Added Solvents or Electrolytes," The Journal of Physical Chemistry. vol. 100 pp. 11086-11097 (1996).

Shedd, G.M., and Russell, P.E., "The scanning tunneling microscope as a tool for nanofabrication," Nanotechnology. vol. 1 pp. 67-80 (1990).

Schultz, D.A., and Tew, G.N., "Electrochemical Oxidation of a Galvinol-Substituted Alkanethiol Monolayer," The Journal of Organic Chemistry. vol. 59 pp. 6159-6160 (1994).

Tsu, R., and Esaki, L. "Tunneling in a finite superlattice," Applied Physics Letters. vol. 22, No. 11 pp. 562-564 (1973).

Umeda et al., "SCFL static frequence divider using InAlAs/InGaAs/InP HEMTs," in Proceedings of the 25th European Microwave Conference. pp. 222-228 (1995).

Uosaki et al., "Electrochemical Characteristics of a Gold Electrode Modified with a Self-Assembled Monolayer of Ferrocenylalkanethiols," Langmuir. vol. 7, No. 7 pp. 1510-1514 (1991).

Weiss et al., "Probing Electronic Properties of Conjugated and Saturated Molecules in Self-Assembled Monolayers," Annals New York Academy of Sciences. vol. 852 pp. 145-168 (1998).

Xia, Y., and Whitesides, G.M., "Soft Lithography," Angewandt Chemie International Edition. vol. 37 pp. 551-575 (1998).

Yamada et al., "Effect of Temperature on Structure of the Self-Assembled Monolayer of Decanethiol on Au(III) Surface," Langmuir. vol. 16 pp. 5523-5525 (2000).

Zamborini, F.P., and Crooks, R.M., "Nanometer-Scale Patterning of Metals by Electrodeposition from an STM Tip in Air," Journal of the American Chemical Society. vol. 120, No. 37 pp. 9700-9701 (1998).

Zohta, "Negative resistance of semiconductor heterojunction diodes owing to transmission resonance," Journal of Applied Physics. vol. 57, No. 6 pp. 2334-2336 (1985).

* cited by examiner

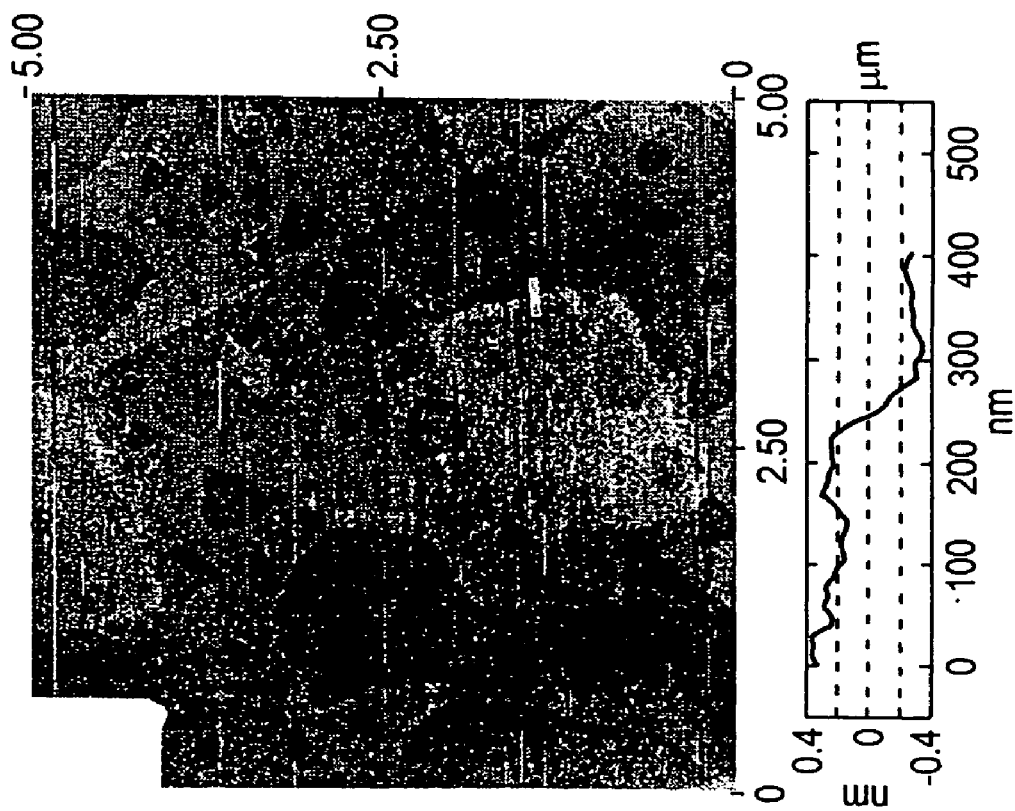
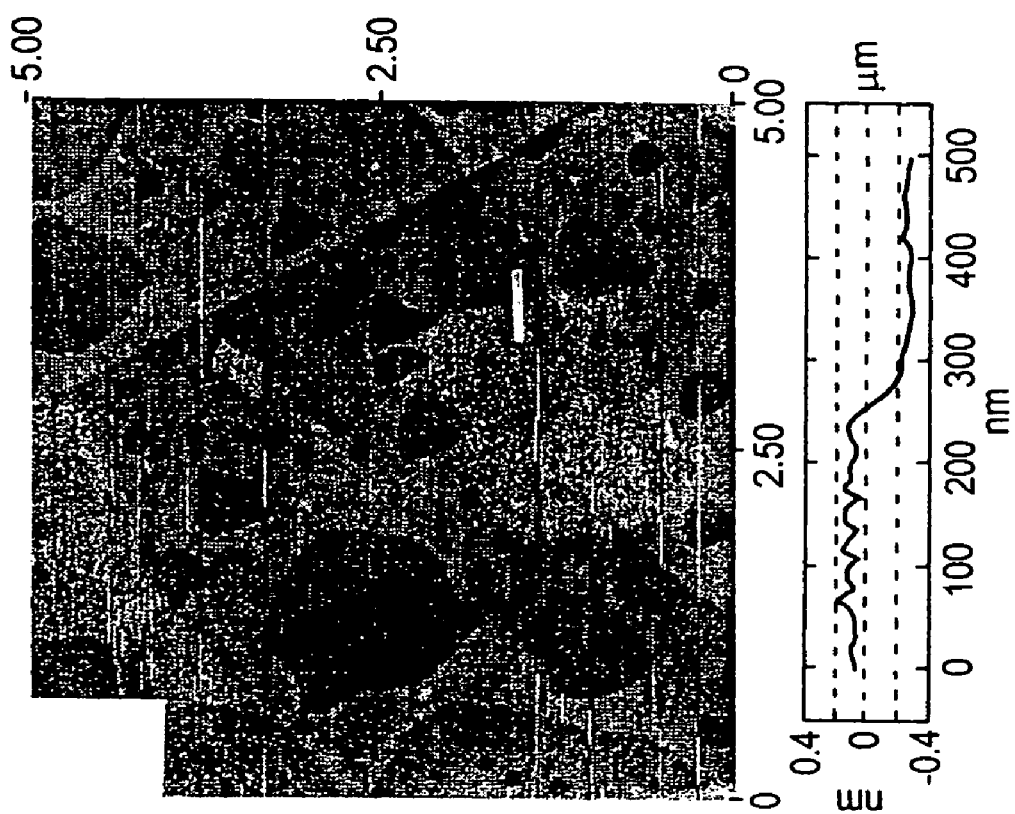
FIG. 6D
FIG. 6C

USE OF ELECTROACTIVE MONOLAYERS IN GENERATING NEGATIVE DIFFERENTIAL RESISTANCE BEHAVIORS AND DEVICES EMPLOYING THE SAME

CROSS REFERENCE TO RELATED APPLICATIONS

This application is based on and claims priority to U.S. Provisional Application Ser. No. 60/359,946, filed Feb. 27, 2002, herein incorporated by reference in its entirety.

GRAND STATEMENT

This work was supported by a grant from the Office of Naval Research, Grant No. N00014-00-1-0633. Thus, the U.S. government has certain rights in the invention.

TECHNICAL FIELD

The present invention relates to negative differential resistance-based structures and applications.

Abbreviations

AFM atomic force microscope or microscopy
Au gold
$C_6SH$ hexanethiol
$C_6S$-SAM A SAM formed from hexanethiol
$C_7SH$ heptanethiol
$C_{11}SH$ undecanethiol
$C_{12}SH$ dodecanethio
$C_{16}SH$ hexadecanethiol
CCD charge coupled display
CD cyclodextrin
CITS continuous imaging tunneling spectroscopy
Fc ferrocene
Fc-$C_{11}$SH ferrocenylundecanethiol
Gal-$C_6$SH phenoxygalvinol-substituted hexanethiol
Gal-$C_6$S-SAM A SAM formed from Gal-$C_6$SH
Fc-$C_{11}$S-SAM A SAM formed from Fc-$C_{11}$SH
HOMO highest occupied molecular orbital
I-V current-voltage
IC imaging conditions
ITO indium tin oxide
LDOS local density of states
LFM lateral force microscopy
LUMO lowest unoccupied molecular orbital
MIM metal-insulator-metal
MIS metal-insulator-semiconductor
MS metal-semiconductor
$N_2$ nitrogen
NDR negative differential resistance
NSOM near-field scanning optical microscopy
PC patterning conditions
PDMS poly(dimethylsiloxane)
Pt platinum
Pt—Ir platinum-iridium alloy
PVR peak-to-valley ratio
RH relative humidity
RTDs resonant tunneling diodes
SAM self-assembled monolayer
STM scanning tunneling microscope or microscopy
v:v volume to volume (ratio)

BACKGROUND ART

A critical step in realizing molecular scale electronics is the elucidation of molecular properties that are analogous to those found in conventional electronic components. In particular, nonlinear current-voltage behaviors are of interest as these behaviors form the basis of several critical classes of devices including switches, amplifiers, and frequency converters. See Sze, S. M., *Physics of Semiconductor Devices*; 2nd ed.; John Wiley and Sons: New York, N.Y., United States of America, 1981; pp 513-520.

In two terminal devices, the nonlinear current-voltage behavior termed negative differential resistance (NDR) is a key property of the Esaki diode and resonant tunneling diodes (RTDs). NDR has also been observed in molecule-based systems. Mathews. R. H., et al., *Proc. IEEE* 1999, 87, 596-605; Chen, J., et al., *Science* 1999, 286; Xue, Y. et al., *Phys. Rev. B* 1999, 59, R7852-7855; Gaudioso, J., et al., *Phys. Rev. Lett.* 2000, 85, 1918-1921; Chen, J., et al., *Appl. Phys. Lett.* 2000, 77, 1224-1226. NDR behavior in RTDs can be tuned with the materials used, dopant concentration, and the physical structure of the device. Zeng, C., et al., *Appl. Phys. Lett.* 2000, 77, 3595-3597; Kinne, M. and Barteau, M. A. *Surf. Sci.* 2000, 447, 105-111; Sun, J. P., et al., *Proceedings of the IEEE* 1998, 86, 641-661; Zhao, P., et al., *J. Appl. Phys.* 2000, 87, 1337-1349; Seabaugh, A.; Hu, Z.; Liu, Q.; Rink, D.; Wang, J. "Silicon-Based Tunnel Diodes and Integrated Circuits" *In 4th International Workshop on Quantum Functional Devices*; Research and Development Association for Future Electron Devices: Japan, 2000, pp 5-8.; Huang, C. Y., et al., *Elect. Lett.* 1994, 30, 1012-1013; Zhao, P., et al., *IEEE Trans. Elect Dev.* 2001, 48, 614-627; Schulman. J. N., et al., *IEEE Elect. Dev. Lett.* 1996, 17, 220-222. In contrast, control of the parameters governing NDR behavior in molecular systems is just beginning to be explored. See e.g., Karzazi. Y., et al., *J. Am. Chem. Soc.* 2001; Xue, Y., et al., *J. Chem. Phys.* 2001, 115, 4292-4299. Additionally, although there have been several reports examining the relationship between NDR and electroactivity in organic (Tao. N. J., *Phys. Rev. Lett.* 1996, 76, 4066-4069) and inorganic systems (Kinne, M. and Barteau, M. A. *Surf Sci.* 2000, 447, 105-111; Kaba, M. S., et al., *J. Vac. Sci. Technol. A* 1997, 15, 1299-1304), the general phenomenon of NDR in molecular scale systems is not well understood. Indeed, there is currently no known sound mechanistic basis as to how NDR is generated in molecular systems. The present invention addresses this and other needs in the art.

SUMMARY OF THE INVENTION

In accordance with the present invention, a negative differential resistance (NDR) device is provided, along with a method of making the NDR device, and method of generating NDR using the NDR device. In one embodiment, the NDR device comprises: a substrate comprising a conductor material or a semi-conductor material; and a self-assembled monolayer (SAM) disposed on the substrate, wherein the SAM comprises a first electroactive moiety and a spacer moiety, the spacer moiety defining a barrier between the electroactive moiety and the substrate, wherein the NDR device exhibits negative differential resistance in the presence of a varying applied voltage.

Accordingly, it is an object of the present invention to provide a novel NDR device. This and other objects are achieved in whole or in part by the present invention.

An object of the invention having been stated hereinabove, other objects will be evident as the description proceeds, when taken in connection with the accompanying drawings and examples as best described hereinbelow.

BRIEF DESCRIPTION OF THE DRAWINGS

FIG. 2A represents relative energy levels of the system at zero bias. FIGS. 2B-2E represent changes in energy levels of the system as it is biased to arbitrary positive potentials. The unfilled circle on each current-voltage (I-V) curve represents the position on the curve for each potential. The arrow in each energy diagram represents the magnitude of current through the system.

FIG. 3A depicts imaging above the SAM (1.0 V, 10 pA); FIG. 3B depicts patterning at increased bias (about 3.0 V, 10 pA); and FIG. 3C depicts imaging of the patterned nanostructure (1.0 V, 10 pA).

FIG. 5A, 115 mV; FIG. 5B, 700 mV; and FIG. 5C, 1800 mV.

FIGS. 6A-6D depict variation in apparent height difference between microcontact printed Fc-$C_{11}$S-SAM and $C_{16}$S-SAM as a function of bias voltage: FIG. 6A, 100 mV; FIG. 6B, 500 mV; FIG. 6C; 1000 mV; and FIG. 6D, 1500 mV. IC: 0.5 Hz and 5 pA, under dodecane. Height profiles shown under each image were obtained from regions indicated by the white line on each image. Profiles were averages of 20 line profiles (about 200 nm).

FIG. 15A depicts representative current-voltage curves of Fc-thiolate before exposure to β-CD.

FIG. 15B depicts representative current-voltage curves of Fc-thiol after exposure to β-CD.

DETAILED DESCRIPTION OF THE INVENTION

I. Definitions

Figure 1A:
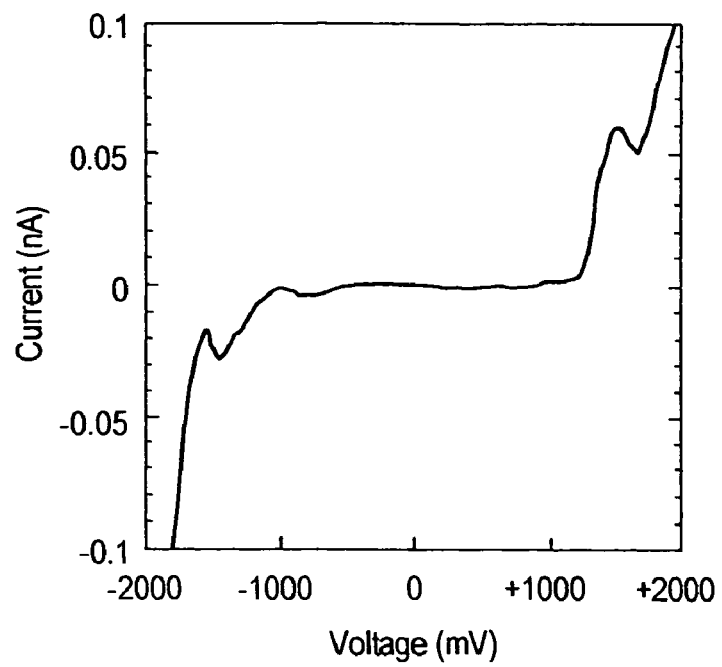
FIG. 1A is a plot depicting a typical current-voltage (I-V) curve collected from Fc-$C_{11}$S-SAM under dodecane.

Following long-standing patent law convention, the terms "a" and "an" refer to "one or more" when used in this application, including the claims.

As used herein, the term "electrical current" refers to the movement of electrons from a higher energy level to a lower energy level. Generally, electrical current is the flow of electrical charge, and can also refer to the rate of charge flow through a circuit.

As used herein, the term "electroactive" refers to having the ability to change electronic configuration. The term refers to a molecule or structure and includes the ability to transfer electrons, the ability to act as a conductor of electrons, and/or the ability to act as an electron donor or acceptor.

As used herein, the term "gold" refers to element 79, which has the chemical symbol Au; the term specifically excludes any connotation related to color or other calorimetric properties.

As used herein, the term "matrix material" refers to any material that forms a component of a monolayer (e.g., a SAM). In one embodiment of the present invention, a matrix material comprises a linker moiety that facilitates association of the matrix material with a surface, an electroactive group that forms an exposed face of the monolayer and is distal to the linker moiety, and a spacer moiety interposed between the linker moiety and the electroactive moiety. The term "matrix material" can refer to a three-dimensional structure, but need not do so. Indeed, in one embodiment, a matrix material forms a coherent formation that is one molecule thick, as in the example depicted schematically in FIG. 8.

The term "microparticle" as used herein denotes a structure that has a longest dimension of about 1000 μm or less. Thus, microparticles can be solid particles ranging in size from about 1 to 1000 μm. A microparticle can have any diameter less than or equal to 1000 μm, including 1, 2, 3, 4, 5, 10, 15, 20, 25, 30, 50, 100, 500 and 750 μm. Drugs, bioactive material, organic compounds, functional groups, and other relevant materials can be incubated with the microparticles, and thereby be adsorbed or attached to the microparticle.

The term "modulator moiety" is meant to refer to a moiety that binds or otherwise interacts with an electroactive moiety of an NDR device of the present invention to modulate NDR in the NDR device. By "modulating NDR" it is meant to include changing the magnitude of the NDR, providing multiple NDR peaks from the device, or any other change in the NDR.

As used herein, the terms "nano", "nanoscopic" "nanometer-sized", "nanostructured", "nanoscale", "nanoparticle complexes" and grammatical derivatives thereof are used synonymously and interchangeably and refer to nanoparticles, nanoparticle composites, and hollow nanocapsules in one embodiment less than or equal to about 1000 nanometers (nm) in diameter, in another embodiment less than about 30 nanometers in diameter, and in still another embodiment less than about 10 nanometers in diameter. A nanoparticle can be fashioned from any material. In one embodiment, a nanoparticle is fashioned of a semiconductor material or conductor material, and in another embodiment of gold, $TiO_2$, or gold or $TiO_2$-containing materials. In another embodiment, a nanoparticle is fashioned of a semiconductor material comprising a biodegradable material. The terms can refer not only to the metal component of a nanoparticle, but the composite of metal and other component parts as well.

The term "nanoparticle" as used herein denotes a structure that has a longest dimension of about 1000 nm or less. Thus, nanoparticles can be solid particles ranging in size from about 1 to 1000 nm. A nanoparticle can have any diameter less than or equal to 1000 nm, including 1, 2, 3, 4, 5, 10, 15, 20, 25, 30, 50, 100, 500 and 750 nm. Drugs, bioactive material, organic compounds, functional groups, and other relevant materials can be incubated with the nanoparticles, and thereby be adsorbed or attached to the nanoparticle.

As used herein, the term "patterning material" refers to any material that is employed to dispose a SAM comprising an electroactive moiety on a substrate in a predetermined pattern. In one embodiment, a patterning material further comprises a spacer moiety and a linker moiety that is adapted to facilitate association of the patterning material (e.g., one or more molecules) with a substrate.

As used herein, the terms "redox compound", "redox center", "redox group," "redox active group," "electroactive group," "electroactive moiety" and "electroactive molecule" are used interchangeably and refer to a molecule or part of a molecule that is able to undergo changes in its electronic properties.

As used herein, the terms "self assembled monolayer (SAM)" and "monolayer" are used interchangeably in some cases and refer to a structure comprising a population of one or more distinct chemical entities which associate with one another to form a coherent formation that is one molecule thick.

As used herein, the term "thiol" refers to a sulfur-containing organic compound with the general formula RSH, where R is any organic structure.

As used herein, the term "thiolate" and "thiolate ion" are used interchangeably and refer to a thiol salt, which can be produced from a corresponding thiol by abstraction of a proton via a base.

As used herein, the terms "varying voltage" and "varying applied voltage" are interchangeable and refer to a voltage that can vary or be varied when applied. A range of variation for the voltage in the generation of NDR can depend on an envisioned application or end use. A representative variation ranges between −3V and +3V. In one embodiment, an electroactive moiety displays low potential electrochemistry where low-potential specifies an electrochemical oxidation or reduction between −3V and +3V.

II. General Considerations for Scanning Tunneling Microscopy

Some of the methods of the present invention rely, in part, on employing a scanning tunneling microscope (STM). For example, a scanning tunneling microscope (STM) system comprising an STM tip can be employed to prepare an NDR device of the present invention, wherein the NDR device comprises a SAM into which an electroactive moiety is patterned.

The scanning tunneling microscope was originally developed for observing the surface structure of a solid sample at the atomic level. In STM operation, a sharp pointed probe is brought within a distance of about 1 nm from the sample surface and a predetermined bias voltage is applied between the sample and the probe. As a result of this configuration, a tunneling current flows between them. The intensity of the tunneling current is very sensitive to the distance between the sample and the probe. The probe is scanned over the sample surface in parallel with the sample surface by being controlled up and down in a direction perpendicular to the sample surface for keeping the intensity of the tunnel current at a predetermined value. By doing this, the unevenness of the sample surface can be observed by the trail of the probe. As noted, scanning tunneling microscopy systems were developed to employ electron tunneling for structural and spectroscopic imaging of the surfaces of samples.

In practice, electron tunneling occurs when a voltage is placed across two conductors separated by a sufficiently thin insulating layer. In STM systems, the first conductor is the tip of the STM system and the second conductor is the sample whose surface is to be imaged. The insulating layer can be a liquid layer or a vacuum between the STM tip and surface of the sample. The current between the conductors (resulting from the voltage across them and the insulating layer) is a function of the conductor or electrode separation and the nature of the electronic states of the tip and sample.

To perform structural imaging in STM systems, the tunneling current between the tip and sample is measured while scanning the tip across the surface of the sample in, for example, a raster pattern. If the distance between the sample and the tip is adjusted to keep the current constant, a plot of the tip-sample distance versus position of the tip provides an indication of the structure of the surface of the sample. To perform spectroscopic imaging, the position of the tip over the sample is fixed for a period of time while the voltage across the tip and sample is varied. A plot of the deviation of the tunneling current against voltage for different positions of the tip enables the spectroscopic imaging of the surface of the sample.

STM has found application in fields distinct from microscopy. For example, STM lithography employing a scanning tunneling microscope (STM) has been employed to generate patterns on a substrate (Ross et al., (1993) *Langmuir* 9: 632; Schoer et al., (1996) *J. Phys. Chem.* 100: 11086; Zamborini & Crooks, (1998) *J. Am. Chem. Soc.* 120: 9700). In STM lithography, atoms or molecules can be adsorbed onto or removed from a substrate with the resolving power determined, in part, by the shape of the tip of a probe. See e.g., Shedd et al., (1990) *Nanotechnology* 1: 67-80).

In this application, a voltage is applied between a probe (also referred to throughout the present disclosure as an STM tip) and a substrate, generating a tunneling current or a field-emitted current between the probe and the substrate. The tunneling current takes the form of an electron beam having a diameter determined, in part, by the shape of the probe tip. The diameter can be reduced to as small as about 1 nm. By supplying a liquid or gas comprising atoms or molecules onto the substrate, while simultaneously applying the tunneling current (electron beam) between the probe and the substrate, the atoms or molecules adsorbed onto the surface can be locally desorbed and the molecules in the liquid or gas can be adsorbed onto only that portion of a substrate on which the tunneling current flows. That is, the spatial composition of molecules adsorbed onto a surface can be varied with the resolving power of the electron beam and determined by the diameter thereof. Thus, an ultra fine pattern is formed, which cannot be formed using photolithography and other related methods known in the art.

STMs are also used in the analysis of current-voltage (I-V) behaviors of molecular assemblies. This can be seen in the CITS experiments described below.

III. Negative Differential Resistance (NDR) Device

The phenomenon of negative differential resistance (NDR) is typically associated with a tunnel diode and similar structures. A hallmark of negative differential resistance is the observation that in a device manifesting NDR, such as a tunnel diode, a current-voltage (I-V) curve shows that in regions in which the slope of the curve is negative, the differential resistance can be less than zero. In practice, then, this observation can manifest as a decrease in current when voltage in increased. This is an unusual phenomenon since it appears to violate Ohm's law (V=iR), which states that an increase in voltage produces an increased current.

NDR elements, such as a degenerated p-n junction diode (the Esaki diode), an AlGaAs/GaAs heterojunction diode using resonant tunneling (Tsu & Esaki, (1973) *App. Phys. Lett.* 22: 562), and a resonance diode with a potential barrier of AlGaAs/GaAs (Zohta, (1985) *J. Appl. Phys.* 57(6): 2234-2236) are known in the art. Generally, a tunnel diode comprises an Ohmic juncture between a p-type material and an n-type material.

NDR has also been observed in molecule-based systems. Mathews, R. H., et al., *Proc. IEEE* 1999, 87, 596-605; Chen, J., et al., *Science* 1999, 286; Xue, Y. et al., *Phys. Rev. B* 1999, 59, R7852-7855; Gaudioso, J., et al., *Phys. Rev. Lett.* 2000, 85, 1918-1921; Chen, J., et al., *Appl. Phys. Lett.* 2000, 77, 1224-1226. NDR behavior in RTDs can be tuned with the materials used, dopant concentration, and the physical structure of the device. Zeng, C., et al., *Appl. Phys. Lett.* 2000, 77, 3595-3597; Kinne, M. and Barteau, M. A. *Surf Sci.* 2000, 447, 105-111; Sun. J. P., et al., *Proceedings of the IEEE* 1998, 86, 641-661; Zhao, P., et al., *J. Appl. Phys.* 2000, 87, 1337-1349; Seabaugh, A.; Hu, Z.: Liu, Q.: Rink, D.: Wang, J. "Silicon-Based Tunnel Diodes and Integrated Circuits" *In 4th International Workshop on Quantum Functional Devices*; Research and Development Association for Future Electron Devices: Japan, 2000, pp 5-8.; Huang, C.Y., et al., *Elect. Lett.* 1994, 30, 1012-1013; Zhao, P., et al., *IEEE Trans. Elect. Dev.* 2001, 48, 614-627; Schulman, J. N., et al., *IEEE Elect. Dev. Lett.* 1996, 17, 220-222. However, in these prior art reports, there is no disclosure of the observation that low potential electrochemistry is a hallmark of good NDR molecules, which is an aspect of the present invention.

A resonant tunneling diode (RTD) is an attractive device goal in the field of molecular electronics. It is a two-terminal device, which can involve less difficulty in integration than three-terminal devices, and RTDs offer great utility in switching and logic functionality. Mathews, R. H., et al., *Proc. IEEE* 1999, 87, 596-605. RTDs also offer the potential to integrate multi-state logic into computing architectures. With the recent and growing interest in the development of molecular electronics, molecular systems displaying NDR and resonant tunneling show great potential as components in RTD's.

RTD devices have utility in several applications, for example semiconductor applications. Resonant tunneling diodes (RTDs) can also be applied in the following areas: digital to analog converters (DACs), clock quantizers, shift registers, and ultralow power SRAM. Resonant tunneling has also been explored in III-V devices, and the following observations have been made: 712 GHz InAs/InGaAs oscillator with 0.3 µW output power (Brown, J. and Pohm, A., *IEEE Trans on Comp, Pack and Manufact Techn. A,* 17(3), pp. 373 (1994); circuit comprising 50 nW TSRAM cell with a 150 µm$^2$ footprint (200×lower power than GaAs SRAM) (Van der Wagt et al., *IEEE Elec. Dev. Lett.* 19, 7 (1998)); generic logic circuits operating at 12 GHz with 20 µm minimum feature size (Williamson et al., *IEEE J. Solid State Circuits* 32(2), pp. 222-231 (1997)); memory circuits (Watanabe et al., *Tech. Dig. IEDM* 92, pp. 475-478 (1992)); multivalued logic circuits (H. Mizuta and T. Tanoue, "The Physics and Applications of Resonant Tunneling Diodes", CUP (1995)); monolithic 4-bit 2 Gsps analogue to digital (ADC) converters (Broekaert et al., *IEEE J. Solid-State Circuits* 33, pp. 1342-1348 (1998)); and 40 GHz static binary frequency dividers (Umeda et al., "SCFL static frequency divider using InAlAs/InGaAs/InP HEMTs" in Proc. 25th European Microwave Conference, pp. 222-228 (1995)).

An RTD typically comprises two tunnel barriers spacing a quantum well from two electrical contacts. In resonant tunneling, these barriers control the probability of electrons moving from one side of the quantum well to another. In particular, electroactive molecules appear to have easily accessible energy levels (reduction or oxidation potentials) for electron tunneling. The magnitude of the NDR current peak, directly related to the number of electrons tunneling resonantly, is affected by the height and width of the barriers on each side of the well. Therefore, in one aspect of the present invention tunnel barriers are modulated (e.g., lower peak currents can mean faster switching) via the inclusion of spacers (which can be of variable thickness, ranging from one to many molecules thick) in an NDR device of the present invention.

In accordance with the present invention, a negative differential resistance (NDR) device is provided, along with a method of making the NDR device, and method of generating NDR using the NDR device. In one embodiment, the NDR device comprises: a substrate comprising a conductor material or a semi-conductor material; and a self-assembled monolayer (SAM) disposed on the substrate, wherein the SAM comprises a first electroactive moiety and a spacer moiety, the spacer moiety defining a barrier between the electroactive moiety and the substrate, wherein the NDR device exhibits negative differential resistance in the presence of a varying applied voltage.

Thus, in one aspect, the present invention pertains to RTD behavior in molecules. More particularly, the present invention pertains to the observation that electroactive molecules display NDR behaviors associated with RTD's.

In other aspects the present invention pertains to (1) NDR in multilayers in which the peak to valley ratio of the NDR response can be controlled by the number of layers; (2) modulation of NDR using binding groups to one of the metal contacts; (3) modulation of NDR using binding groups to the electroactive moiety itself; and (4) NDR devices that display multiple peaks in the current-voltage curve that contain electroactive moieties that have multiple low potential electrochemical oxidations and/or reductions.

Thus, in accordance with the present invention, modulation of NDR in an NDR device is also provided. Two representative approaches include associating spacer moieties (e.g. thioalkyls) with a metal contact (e.g. thiols on STM tip, Laboratory Example 5) and binding groups (i.e. modulator moieties) to the electroactive moiety itself (e.g. cyclodextrin on ferrocenyl group, Laboratory Example 6).

III.A. Substrates

In one embodiment, a substrate employed in a NDR device of the present invention comprises a conductor material or a semiconductor material. Thus, metals, metal oxides, conductive polymers, and electroactive materials are exemplary materials.

Representative conductor materials and semiconductor materials include metals and metal oxides such as, but not limited to titanium, titanium dioxide, tin, tin oxide, silicon, silicon dioxide, iron, iron$^{III}$ oxide, silver, gold, copper, nickel, aluminum, steel, indium, indium tin oxide, fluoride-doped tin oxide, ruthenium oxide, yttrium-barium-copper oxide, germanium cadmium selenide, cadmium sulfide, and titanium alloy. In one embodiment, a conductor material or a semiconductor material is gold, indium tin oxide (ITO), or tin oxide ($TiO_2$), which are characterized by their well-characterized reactivity and electrochemical profiles. Additional semiconductor materials include, but are not limited to silicon; germanium; any III-V semiconductor such as (but not limited to) gallium arsenide or indium phosphide; any II-VI semiconductor such as (but not limited to) zinc sulfide or zinc selenide; and combinations thereof.

Another consideration when selecting a material for a substrate component is the chemical reactivity profile of the material. The chemical reactivity profile of a proposed substrate material is a consideration, because other entities, such as thiol-containing moieties, are ultimately associated with the substrate. Additionally, it can be desirable to associate a secondary component with a substrate to form a heterogeneous SAM. Therefore, the reactivity of a substrate component toward a desired secondary component can also be a consideration. Summarily, considerations when selecting and/or designing a substrate component can include size, material, chemical reactivity of the material, the ease with which a desired chemical moiety can associate with the substrate component, and the ease with which a secondary component can associate with the substrate component.

If a substrate is to be a site for NDR device formation, it is advantageous that the substrate is free of defects. Additionally, due to the small scales at which the various aspects of the present invention can be employed, a substrate can comprise virtually any kind of structure. For example, although in one embodiment a substrate for SAM formation comprises the face of a microchip or a similar flat substrate, the substrate of a spherical, tubular, or other particle of any geometric shape can also serve as a substrate for SAM formation. In one embodiment, when a microchip or other structure is employed as a substrate, the areas of the substrate upon which a SAM will be formed are coated with a material with which a matrix material can be associated (e.g., a layer of gold, ITO, or other material). This might not be a consideration, depending on the chemical composition of the exposed areas of the substrate. A substrate component need not be entirely flat, and need only comprise a substrate suitable for forming a monolayer thereon. Thus, structures such as gold balls, which can be formed by melting the end of a gold wire, can also serve as a substrate component on which a monolayer can be formed.

In one embodiment, a substrate in accordance with the present invention is a gold substrate. However, other substrates can be employed in the present invention. For example, indium tin oxide (ITO) can be employed as a substrate. ITO is a transparent conductor and can impart an advantage in characterization of the substrate, since both electrochemical and transmission optical methods are available. Overall, detection of gold, semiconductor molecules, and/or nanoparticles can be accomplished conveniently on ITO by electrochemistry, scanning tunneling microscopy, scanning electron microscopy, and Auger microscopy. Also, bonding to metal oxides is very stable, which offers additional advantages.

III.B. Self-Assembled Monolayers (SAMs)

A self-assembled monolayer (SAM) is disposed on a substrate in a NDR device of the present invention. When formed, a monolayer is one molecule thick, although the dimensions of the monolayer can vary with the chemical composition and structure of materials employed in the SAM. In one embodiment, the SAM comprises a first electroactive moiety and a spacer moiety, the spacer moiety defining a barrier between the electroactive moiety and the substrate, wherein the NDR device exhibits negative differential resistance in the presence of a varying applied voltage. In one embodiment, a XXX-thiolate SAM (where XXX is any functional group) refers to a SAM prepared via the exposure of XXX-thiol to gold.

Preparation of a SAM can be readily achieved, due to the chemical composition of the SAM. More specifically, a SAM is a self-assembled structure. Thus, under suitable conditions, a SAM spontaneously assembles on an appropriate substrate. Upon formation of a SAM, a substrate can be wholly or partially covered. Additionally, in one embodiment a SAM forms areas of uniform coverage. Uniformly covered areas are identified as areas in which coverage is consistent and free from defects, such as pitting, rifts, and general unevenness in coverage.

Sometimes, it will be desirable to form a homogeneous SAM. A homogeneous SAM comprises a single species of spacer moiety. That is, a homogeneous SAM comprises a spacer moiety of one uniform chemical species. Other times, it will be desirable to form a heterogeneous SAM. A heterogeneous SAM comprises two or more species of spacer moieties.

Figure 8:
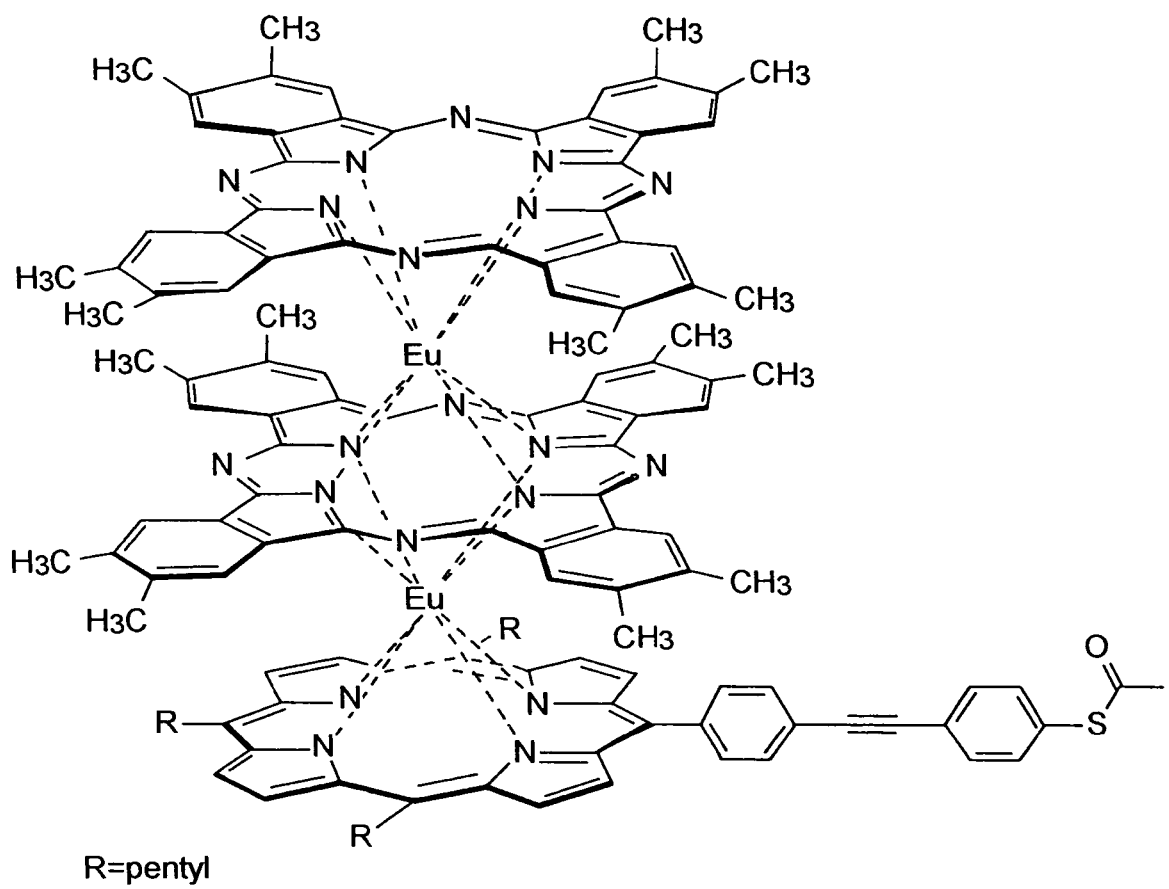
FIG. 8 is structural schematic of a multi-porphyrin SAM comprising an electroactive species that displays multiple electrochemical oxidations and reductions. Electrochemical oxidations or reduction are shown for the depicted multi-porphyrin system and correlate with the multiple NDR peaks in the current-voltage curve shown in FIG. 9.
Figure 9:
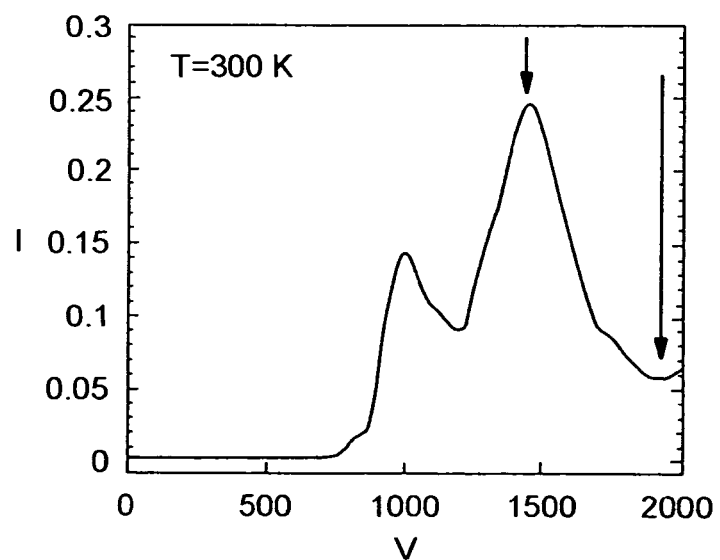
FIG. 9 is a graphical presentation of the peak to valley ratios provided by a NDR device of the present invention, wherein multiple NDR peaks are observed and the NDR device comprises a multi-porphyrin SAM. Arrows label the peak and valley.

In another example, a SAM of the present invention can comprise a multicomponent SAM. FIG. 8 depicts such a multicomponent system comprising a plurality of porphyrin rings. In this example, the porphyrin rings are coordinated via a plurality of europium atoms. These porphyrin structures are stacked in a multi-"storied" arrangement. The associated current-voltage plot depicted in FIG. 9 shows the NDR effect achievable by employing this representative but non-limiting molecule-based SAM.

III.B.1. Spacer Moieties

In a NDR device of the present invention, a spacer moiety defines a barrier between the electroactive moiety and the substrate. Optionally, the spacer moiety is a branched or straight chain alkyl of 1-20 carbon atoms, a branched or straight chain alkenyl of 1-20 carbon atoms, a branched or straight chain alkynyl of 1-20 carbon atoms, and substituted versions thereof. Thus, the spacer moiety need not comprise a straight chain moiety and can comprise any desired structure and functional group(s). Aromatic spacer moieties, such as the phenyl ethynyl spacer shown in FIG. 8, are also provided. Representative aromatic spacers thus include phenyl, benzyl, alkenylbenzyl, alkenylphenyl, alkynlbenzyl, alkynylphenyl, naphthalenyl, indenyl, and substituted versions thereof.

Some additional examples of suitable spacer moieties include organomercaptans such as diacetylenic thiols, for example, ω-functionalized n-alkanethiols. Such compounds can comprise an unlimited number of backbone carbon atoms. Representative compounds comprise a group that is hydrophilic such as $HS(CH_2)_nCOOH$ or $HS(CH_2)_nCH_2OH$ where n is any integer from 1 to 50, in one embodiment n is 1, 2, 3, 4, 5, 6, 7, 8, 9, 10, 11, 12, 13, 14, 15, 16, 17, 18, 19 or 20; a group that is hydrophobic such as $HS(CH_2)_nH$ where n is any integer from 1 to 50, in one embodiment n is 1, 2, 3, 4, 5, 6, 7, 8, 9, 10, 11, 12, 13, 14, 15, 16, 17, 18, 19 or 20; a group that specifically binds to other moieties such as an antibody fragment, single-stranded DNA, biotin, nickel nitrilotri-acetic acid; a group that resists non-specific adsorption such as oligoethylene glycol; or a group that is chemically reactive such as amino, pentafluorophenyl or carboxylate. Thus, different substrate-spacer material complexes can be formed.

For example, as disclosed in the Examples, thiols can be disposed on metals such as gold, silver, copper, platinum, palladium, and nickel. In other embodiments, thiols can be disposed on indium tin oxide; isocyanides can be disposed on platinum; carboxylic acids can be disposed on metal oxides; hydroxamic acids can be disposed on metal oxides; trichlorosilanes can be disposed on silica; and trialkoxysilanes can be disposed on silica. It is noted that the above list is presented for illustrative purposes and is not an exclusive list of all materials that can be employed as a spacer moiety in accordance with the present invention.

III.B.2. Electroactive Moieties

A NDR device of the present invention comprises a SAM that comprises a first electroactive moiety. An electroactive molecule responds to application or removal of an electrical bias to the material by altering a physical property. Thus, electroactive molecules are also are generally described by the term "redox active". For example, application of an electrical bias to an electroactive molecule can alter the relative transconductance of the molecule when probed between two metal electrodes, such as an STM tip poised above the molecule while anchored to a metal substrate. This phenomenon is generally known as "bias dependency". When the relative transconductance of an electroactive group-comprising molecule varies with respect to its surroundings, and this is manifested as a difference in the relative tunnel current between the STM tip and substrate (and thus, the relative height of the STM tip with respect to the SAM/substrate), this phenomenon is known as "bias dependent contrast". Thus, upon application of an electrical bias, an electroactive molecule exhibits properties that contrast it with its immediate environment.

The chemical composition of an electroactive compound varies, although representative electroactive molecules include ferrocene-terminated and galvinoxyl-terminated compounds. Selection of a suitable electroactive component can be dependent on the application in which the NDR device will be employed. Thus, the electroactive moiety can optionally be selected from the group including, but not limited to ferrocene; galvinol; known electroactive coordination compounds of copper (I) and copper (II); known electroactive coordination compounds of iron (II) and iron (III); viologen and its derivatives; quinines; anthroquinones; cyanines; porphyrins; meso-substituted porphyrins; beta-substituted porphyrins; multi porphyrin arrays; bipyridyl complexes of ruthenium, osmium, iron, cobalt, and nickel; phenanthroline complexes of ruthenium, osmium, iron, cobalt, and nickel; cyanide complexes of iron, molybdenum, iridium, and cobalt; and salen complexes of manganese, nickel, and cobalt. In one embodiment, an electroactive moiety, or a complex thereof, displays low potential electrochemistry where low potential specifies an electrochemical oxidation or reduction between −3V and +3V.

By way of additional example, FIG. 8 depicts a multicomponent porphyrin molecule-based SAM, which can be disposed on a substrate. Preferably, the molecule-based SAM is disposed on the substrate via the thiol spacer shown in FIG. 8. The structure depicted in FIG. 8 is a porphyrin compound capable of multiple oxidations and reductions. In FIG. 8, many layers of porphyrin structures can be coordinated sequentially with each other in a single molecule. For example, a porphyrin system can be coordinated with those above and below it. In the example of FIG. 8, porphyrin rings are coordinated with each other via europium atoms. Other coordinating atoms would be apparent to one of ordinary skill in the art after a review of the disclosure of the present invention presented herein.

FIG. 9 indicates that multiple oxidations and reductions are achievable from the structure depicted in FIG. 8. More particularly, multiple oxidations and reductions arising from the multi-porphyrin SAM structure of FIG. 8 are depicted in the current-voltage diagram of FIG. 9. The multiple peaks and valleys of FIG. 9 correlate with multiple, low potential oxidations or reductions observed in the cyclic voltammogram (e.g. electrochemistry) of the molecule. Thus, FIG. 9 illustrates that multiple NDR peaks can be obtained on SAMs comprising molecules with multiple, low potential oxidations or reductions, and forms an aspect of the present invention.

To elaborate, FIGS. 8 and 9 indicate that molecules that display multiple, redox-accessible (from electrochemistry) oxidations or reductions are good candidates for displaying multiple NDR peaks when a current-voltage plot (FIG. 9) of them is obtained in one of any monolayer-based configurations. Although it is not applicants' desire to be bound by a particular theory of operation, it is viewed that NDR is not an electrochemical phenomenon; rather, it is a steady-state current phenomenon, and that electrochemical behaviors (in this case, multiple redox peaks) correlate with NDR behaviors. It is also viewed that the present disclosure represents the first example of molecule-based NDR showing multiple peaks in the current-voltage curve.

In one embodiment, the electroactive moiety, the spacer moiety, and the linker moiety (described below) of the SAM embody the same molecule. In this case, the electroactive moiety can be located distal to the linker moiety so that the spacer group defines an appropriate barrier for the NDR device.

In one embodiment the electroactive moiety is distributed within the SAM in a predetermined pattern. By the term "predetermined pattern", it is meant placing, distributing, substituting, or replacing one or more electroactive moieties into the SAM according to a rational scheme associated with imparting NDR to the structure. For example, upon formation of a SAM, a substrate can be wholly or partially covered. Thus, spacer moieties bearing electroactive moieties can be introduced into the SAM by disposing them in the uncovered areas or by replacing spacer moieties not bearing electroactive moieties in the covered areas. Representative but non-limiting patterning methods are disclosed hereinbelow.

The SAM can further comprise a second electroactive moiety, wherein the second electroactive moiety has a different NDR characteristic from the first electroactive moiety. The first and second electroactive moieties are also preferably distributed within the SAM in a predetermined pattern. For example, a SAM region comprising two different electroactive moieties mixed together in the SAM region. In this case, multiple NDR peaks, each due to one of the two SAM-forming components can be observed. As an additional example, two adjacent SAM regions comprising two different electroactive moieties wherein the moieties are segregated from one another on the surface but are anchored in regions contiguous to one another are also provided. In this case, NDR can be modulated due to charge transfer from one SAM region to another.

III.B.3. Linking Groups

A SAM of a NDR device of the present invention can further comprise a linker moiety. In one embodiment, the linker moiety links the substrate and the spacer moiety, and the spacer moiety and linker moiety embody the same molecule. In another embodiment, the linker moiety is a thiol moiety, which facilitates association of the spacer moiety with the substrate. Thus, in one embodiment a spacer moiety comprises dodecanethiol, although any chemical moiety comprising a thiol moiety can also be employed (e.g., any alkanethiol). Spacer moieties comprising a thiol moiety can be employed due to the ability of the thiol to chemically associate with a substrate such as gold.

Any linker moiety can be employed, and the selection of a suitable linker moiety can depend, in part, on the nature of the substrate with which a spacer group will ultimately be associated. In one embodiment, a linker moiety of the present invention can associate with a selected substrate. Other representative linker moieties thus include, but are not limited to isocyanides, carboxylic acids, sulfonic acids, phosphonic acids, hydroxamic acids, alcohols, amines, monochlorosilanes, dichlorosilanes, trichlorosilanes, monoalkoxysilanes, dialkoxysilanes, and trialkoxysilanes.

Optionally, the SAM further comprises a second linker moiety that links the electroactive moiety to the spacer moiety. In this case the first and second linkers can be the same or different. For example, the first and second linkers can each be a thiol moiety.

III.B.4. Modulator Moieties

The term "modulator moiety" is meant to refer to a moiety that binds or otherwise interacts with an electroactive moiety of an NDR device of the present invention to modulate NDR in the NDR device. By "modulating NDR" it is meant to include changing the magnitude of the NDR, providing multiple NDR peaks from the device, or any other change in the NDR.

In one embodiment the modulating of NDR can be accomplished by use of a modulator moiety in solution that can alternatively bind or dissociate from the electroactive moiety. One example is cyclodextrin binding to ferrocenyl groups, as described in Laboratory Example 6.

III.C. Multimeric and Multilayered Structures

Optionally, the SAM further comprises one or more additional electroactive moieties and one or more additional spacer moieties, wherein the electroactive moieties and the spacer moieties are the same or different, and wherein the one or more additional spacer moieties interconnect the one or more additional electroactive moieties to the first electroactive moiety and to themselves. In this case, a linker moiety can interconnect the spacer moieties and electroactive moieties.

Thus, a SAM of a NDR device of the present invention can further comprise a species that is adapted to form multimeric species. When such a species is employed, a resulting SAM can comprise multimeric species in a predetermined pattern. When a multimeric structure is desired in a region of patterned desorption of the SAM or in a region of matrix material, there are at least two strategies for placing the species in a desired area of a surface. First, the multimeric species can be formed (i.e., multimerized) before it is exposed to the monolayer (which can comprise matrix material or patterning material) present on a surface. The multimerization can be achieved by derivatizing a compound and linking two or more compounds together. Subsequently, the multimeric species can be disposed in a solvent and associated with the surface in the regions from which matrix material is desorbed or in regions of the matrix material.

In a second strategy, a multimeric species can be "grown" in situ following replacement of matrix material with a replacement material adapted to form multimeric species or after formation of a SAM comprising matrix material. Such multimers can initially be formed end-to-end (i.e., electroactive moiety-to-electroactive moiety or electroacbve moiety-to-linker moiety). A patterning material or a matrix material that is adapted to form multimeric species can also comprise compounds adapted to form branched structures.

In one application of this second strategy, a patterning material is disposed in a solvent. The patterning material is associated with a surface as described herein above. A property of the patterning material is that it comprises a reactive functional group at a point on the material that is distal to the surface. Once the patterning material forms a component of a monolayer on the surface, the material can form a scaffold for the preparation of a multilayered structure extending beyond the one molecule thick dimensions of the matrix material on the surface. In one embodiment of the present invention, NDR peak to valley ratio in a multilayered SAM-based device can be increased/decreased by increasing/decreasing the number of layers in the multilayered SAM. See FIGS. 10 and 11.

Once a patterning material comprising a reactive functional group has been associated with the surface, a second material can be reacted with the reactive functional group of the patterning material to form multimeric and/or multilayer structures. The second material can optionally comprise the same chemical composition as the patterning material. The conditions for such a reaction are dictated, in part, by the nature of the reactive group. In one embodiment, a reactive functional group is selected such that a secondary material (which can also be the same chemical species as the patterning material) can be reacted with, and covalently joined to, the patterning material without interacting with the matrix material. Thus, in one embodiment, the reactive functional group comprises a linker moiety. A secondary material can comprise virtually any chemical species, although it should be compatible with a chosen reactive functional group. In one embodiment, a secondary material comprises a form of the matrix material derivatized with a reactive functional group.

When a secondary material is reacted with a patterning material, the secondary material is covalently joined with the patterning material. Physically, this joining extends the dimensions of the patterning material and, depending on the nature of the secondary material, can extend the dimensions by angstroms or nanometers. Structurally, this extension typically takes the form a structure extending away from the one molecule thick monolayer of matrix material. Effectively, the joining of a secondary material with a patterning material leads to a "raised" structure on a surface, with matrix material extending to a first degree away from the surface (in a homogeneous monolayer, the first degree comprises the length of one matrix material molecule) and secondary material extending the length to a second degree. This imparts a "raised" effect to the surface. Multiple rounds of extension can be performed (if the secondary material comprises a reactive functional group) in order to extend the dimensions of secondary material to any desired distance from the surface or from the matrix material.

In an alternative embodiment, a monolayer can comprise a matrix material comprising a reactive functional group (in one embodiment, a linker moiety) distal to the surface and an unreactive patterning material. When this arrangement is employed, a patterned structure can be created, with the patterning material forming the bottom of the desorbed pattern and multiple layers of matrix material forming the sides of the pattern. Since formation of multimeric or multilayer structures extending from the patterning material is not possible in this arrangement, extension of the matrix material away from the surface can be achieved by forming multilayer and multimeric structures extending from a scaffold of matrix material. This structure can comprise patterning material at a first distance from the surface (typically, the length of a molecule of patterning material) and multiple layers of matrix material at a second distance from the surface, extending the matrix material beyond the first distance.

A multilayered structure can comprise alternating layers of different patterning materials. Patterning materials can be different in their chemical profiles (e.g., redox properties), which can be a property of a functional group element of a patterning material. In one embodiment, in a multilayered structure incorporating patterning material, the patterning material comprises an electroactive moiety and a linker moiety adapted to associate the patterning material with either a surface or a functional group (e.g., another linker moiety) of a patterning material.

Figure 11:
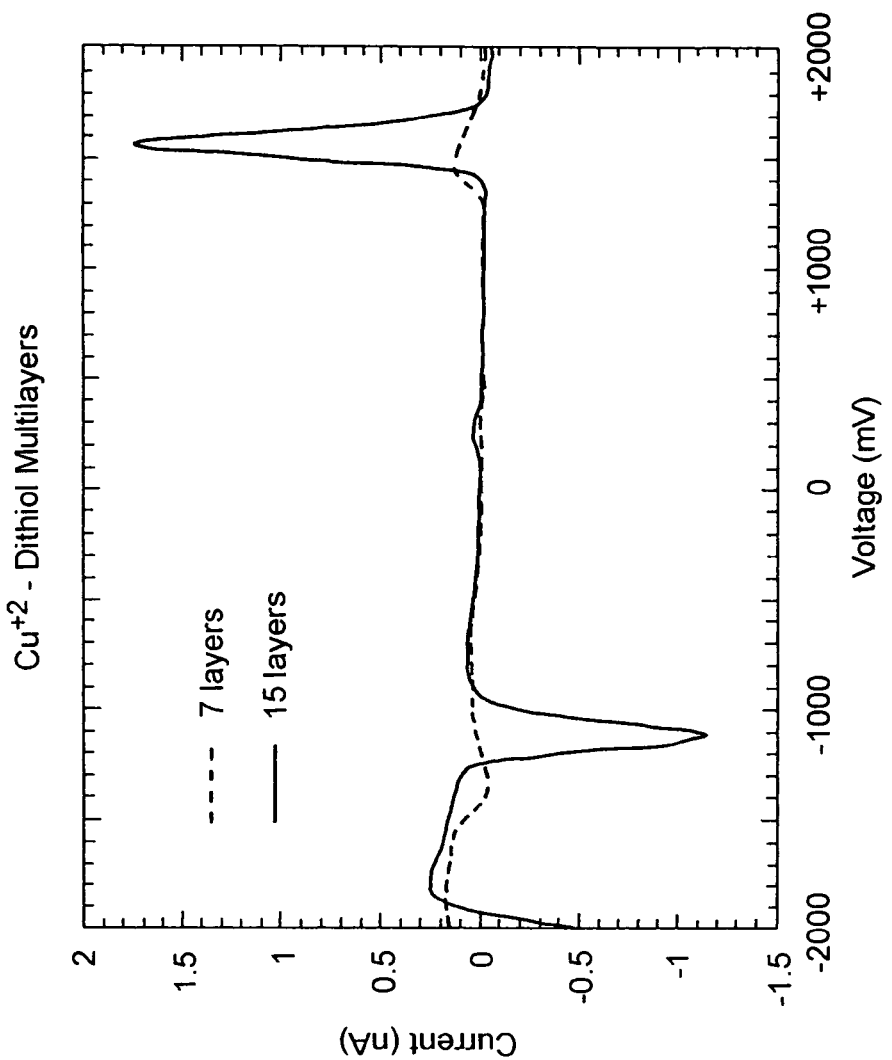
FIG. 11 is a graphical presentation of multiple peaks provided by a NDR device of the present invention. The NDR device comprises a multilayered copper thiol SAM, depicted schematically in FIG. 10. Solid grey line=seven (7) layers; solid black line=fifteen (15) layers.
Figure 10:
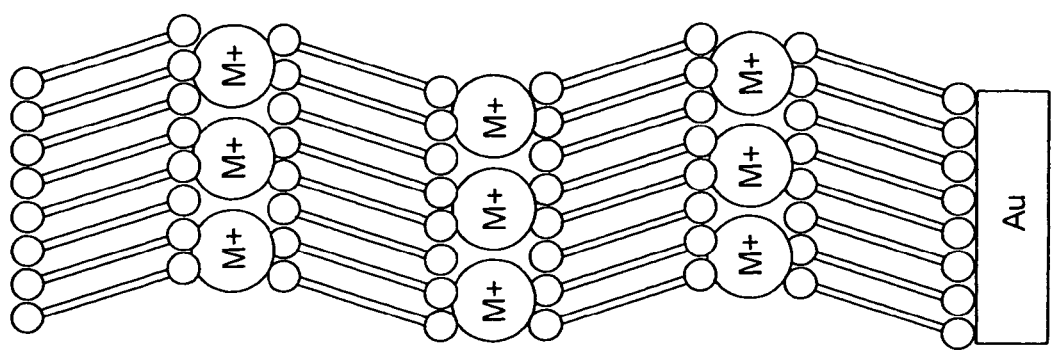
FIG. 10 is a structural schematic of a multilayered SAM of a NDR device of the present invention, where M+ is a metal ion and Au is a gold substrate.

FIG. 10 is a structural schematic of a multilayered SAM of a NDR device of the present invention, where M+ is a metal ion and Au is a gold substrate. FIG. 11 is a graphical presentation of multiple peaks provided by a NDR device of the present invention. The NDR device comprises a multilayered copper thiol SAM, depicted schematically in FIG. 10. Solid gray line=seven (7) layers; solid black line=fifteen (15) layers. Thus, in one embodiment, a NDR device of the present invention exhibits two or more negative differential resistance peaks in the presence of a varying applied voltage.

IV. Method of Preparing an NDR Device

A method of preparing an NDR device is also disclosed in accordance with the present invention. In one embodiment, the method comprises: (a) providing a substrate comprising a conductor material or a semiconductor material; and (b) disposing on the substrate a self-assembled monolayer (SAM) wherein the SAM comprises an electroactive moiety and a spacer moiety, the spacer moiety defining a barrier between the electroactive moiety and the substrate, to thereby prepare an NDR device that exhibits NDR in the presence of a varying applied voltage.

IV.A. SAM Formation

By way of a particular example, after selecting a suitable substrate material, the substrate can be prepared for monolayer formation. It is advantageous for optimal monolayer formation that any facets of the substrate be annealed. This annealing can be achieved by exposing the facets to a $H_2$ flame prior to monolayer deposition. For example, an end of a gold wire (0.5 mm, 99.9985%, Alfa Aesar, Ward Hill, Mass., United States of America) can be melted in a $H_2$ flame to create a small faceted ball. The ball can be subsequently zone refined to yield Au(111) facets along the equatorial region of the ball.

Following preparation of the substrate, a monolayer is disposed on the substrate. In one embodiment, a monolayer forms a self-assembled monolayer (SAM). That is, in this embodiment, a SAM forms spontaneously on the substrate and without the need to perform involved chemical reactions.

In one embodiment of the present invention, a substrate comprises a gold ball, a matrix material comprises a thiol. One embodiment of a procedure for the formation of a monolayer comprises the following. A freshly annealed ball is placed in a 1 mM $C_XH_YSH$ ethanolic solution, where X and Y are integers (e.g., $C_{12}H_{25}SH$, Aldrich, St. Louis, Miss., United States of America), refluxed for 1 hr (Weiss et al. (1996) Ann. NY Acad. Sci. 852:145), and allowed to cool to room temperature. The faceted ball is then removed, rinsed with copious amounts of absolute ethanol (AAPER Alcohol and Chemical Co., Shelbyville, Ky., United States of America), and dried in a stream of $N_2$.

Although the NDR devices and methods of the present invention can employ organothiolates on a gold substrate (i.e. a SAM prepared via the exposure of an organothiol to a gold substrate), metal oxide substrates can also be employed. Bonding to metal oxides is very stable, which offers an advantage in repetitive operation of the NDR devices and molecular electronics components of the present invention. The procedure for preparing a metal oxide substrate is similar to single layer coverage on metal oxide substrates employing zirconium tert-butyl butoxide coatings, which can be prepared as an aerosol under reduced pressure of $10^{-2}$ Torr. Additionally, metal tert-butoxides do not form multilayers, which can be desirable in certain applications.

Following coverage with a monolayer, the substrate layer can be further covalently modified using alkyl phosphonates, carboxylates, or other compounds. This procedure provides for covalent substrate attachment of mixed monolayers on a variety of metal oxide substrates (Tao, (1996) Phys. Rev. Lett. 76: 4066). Moreover, exploration of several substrate functionalization strategies can solve problems that might be encountered during certain investigations, such as phase separation.

IV.B. Patterning of Electroactive Moieties

After a suitable SAM is prepared on a surface, regions of the SAM can be desorbed so as to form a pattern in the SAM by employing STM methods and equipment. In one approach that is also described in the Examples presented below, imaging and pattern formation can be performed at room temperature by employing an STM (e.g., a NANOSCOPE IIIa™, available from Digital Instruments, Santa Barbara, Calif., United States of America) in dodecane with mechanically cut Pt—Ir tips (90:10, 0.25 mm, Alfa Aesar, Ward Hill, Mass., United States of America). The tip can be rastered over the surface in a desired pattern to create a desorption pattern of desired dimensions and location. During the rastering, the tip-substrate bias can be elevated from levels suitable for imaging a surface (e.g., about +1 V) to a level suitable for desorbing matrix material from the surface (e.g., about +3 V for a dodecanethiolate matrix material).

The amount of the SAM that is desorbed from the surface can be dependent on the rastering pattern. For example, if it is desired to make a pattern that has equal dimensions, the tip can be rastered in the x direction motion, while gradually altering the tip's position in the y direction to reach a dimension equal to that of the x dimension. Any pattern is possible via the methods of the present invention and any geometry can be generated.

Substitution into the SAM with a molecule comprising a spacer moiety and an electroactive moiety can be performed concurrent with desorption of portions of the SAM. In this case, the patterning material can be disposed in a solvent that contacts the SAM and the STM tip. Exemplary conditions for performing a substitution operation comprise maintaining relative humidity between 50 to 60% (which can be monitored with a hygrometer). Nitrogen gas can be bubbled through a gas dispersion tube into a closed vessel containing MILLIQ™ water (18μ $cm^2$), and can feed the moist outlet gas into the atmospheric chamber containing the STM. Micromolar concentrations of solutions comprising a patterning material in a solvent can be employed.

IV.B.1. Vapor Deposition Method

A vapor diffusion method for preparing an NDR device of the present invention is provided in accordance with the present invention. In the method, a vapor comprising a patterning material (e.g., a volatile thiol) is ushered down a pattern. By controlling and accounting for (1) the relative exposure time, (2) patterning material vapor pressure, and (3) the use of any pressure to encourage mobility of a patterning material along the length of a pattern, a SAM comprising an electroactive moiety in accordance with an NDR device of the present invention can be created.

In one embodiment, a pattern is prepared by desorbing matrix material from a surface. A plug of material permeated with a patterning material is placed in the proximity of the pattern. Conditions in the area of the pattern are then set to levels such that the patterning material can diffuse out of the plug and associate with a surface that was exposed during formation of the pattern. The SAM comprises a greater concentration of patterning material in the areas closer to the plug, while the SAM comprises a lower concentration of patterning material in the areas more distal to the plug.

In this method, the local environment of the pattern, in which a plug comprising a volatile patterning material is disposed, can be maintained at a given pressure. In one embodiment, the pressure is such that patterning material does not diffuse out of the plug, which is placed at a first end of the pattern, until it is desired that the material leave the plug. After placement of an optional cover element, the pressure can be varied to facilitate diffusion of patterning material out of the plug and down the pattern towards a second end. The variation in the pressure at which a system is maintained can be dependent on the vapor pressure of the patterning material. Thus, by varying the pressure, the rate and amount of material diffusing out of the plug can be controlled.

In operation, the pressure can be varied such that a larger concentration of patterning material can be disposed in the area nearest the plug, while a lesser concentration of patterning material can be disposed in a area distal to the plug. Since in one embodiment the patterning material comprises a linker moiety adapted to associate the material with the surface, the material can form regions of high and low patterning material concentration. Following association of the material with the surface via a linker moiety, the cover element can be removed, if a cover element was employed.

IV.B.2. Microcontact Printing Method

The present inventive methods for preparing an NDR device can be extended to partial or complete deposition of a SAM via a microcontact-printed stamp and dilute patterning material solution. Broadly, a stamp can be inked with a very dilute solution of one of the components and rolled across the surface, increasing or decreasing the velocity during the process. By rolling the stamp progressively more rapidly over the surface and a knowledge of the relative effect of contact time on SAM formation, patterns of electroactive moieties can formed.

An application component is the element that will transfer a patterning material to the surface. An application component can comprise any material; in one embodiment, PDMS. It is noted that an application component can comprise more than a single element. The application component is then contacted with a patterning material to form a coated application component. This step can be referred to as "inking" the application component. Inking the application component can be achieved by contacting the application component with patterning material. The application component is then applied to the substrate to form a SAM comprising an electroactive moiety thereon.

Altering various parameters of the method can control the amount of patterning material transferred from an application component to a surface. For example, by altering the rate at which an application component is moved over the surface, different concentrations of patterning material can be transferred to the surface. Additionally, various application component geometries can also lead to different patterning material concentrations on the surface.

V. Method of Generating NDR

A method of generating negative differential resistance (NDR) is also disclosed. In one embodiment, the method comprises: (a) providing an NDR device comprising: (i) a substrate comprising a conductor material or a semiconductor material; and (ii) a self-assembled monolayer (SAM) disposed on the substrate, wherein the SAM comprises an electroactive moiety and a spacer moiety, the spacer moiety defining a barrier between the electroactive moiety and the substrate, wherein the NDR device exhibits negative differential resistance in the presence of a voltage; and (b) applying a varying voltage to the NDR device provided in step (a), whereby a negative differential resistance is generated.

Figure 12A:
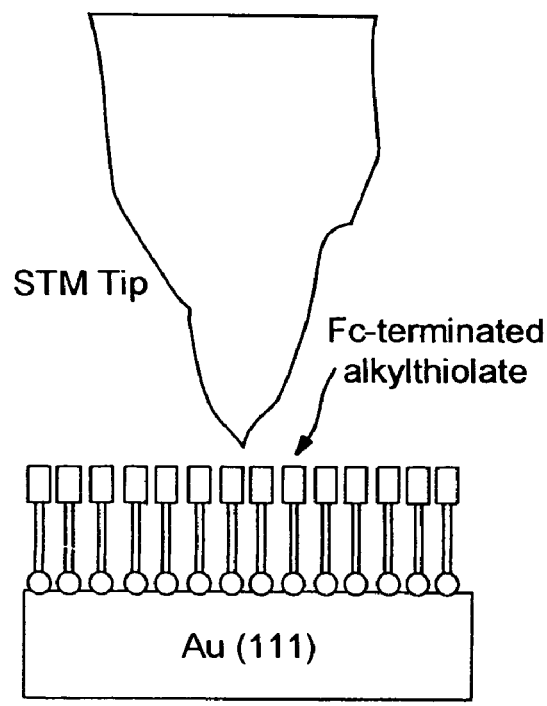
FIG. 12A is a structural schematic of a sample surface probed by an STM tip. The figure depicts Fc-terminated thiolate SAM deposited on Au(111) probed by an uncoated STM tip.
Figure 12B:
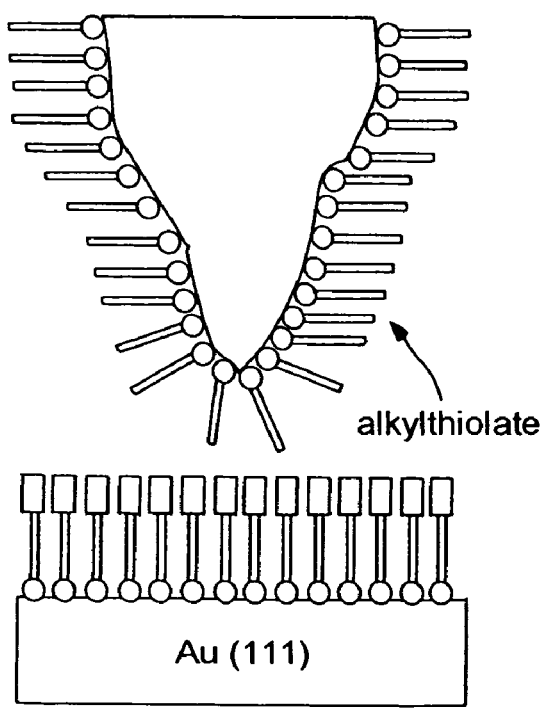
FIG. 12B is a structural schematic of a sample surface probed by an STM tip. The figure depicts Fc-terminated thiolated SAM probed by a thiolate-coated STM tip.

The varying voltage can be applied via an STM tip, as disclosed in the Examples presented herein below. Additionally, FIG. 12A schematically depicts a sample surface being probed by an uncoated STM tip. A coated STM tip can also be employed, as schematically depicted in FIG. 12B. In FIGS. 12A and 12B, the STM tip comprises a monolayer comprising an alkylthiolate coating. Alternatively, the varying voltage can be applied in the implementation of a molecular electronic component comprising an NDR device of the present invention. Thus, application of a voltage in any setting is provided in the methods of the present invention.

Figure 13A:
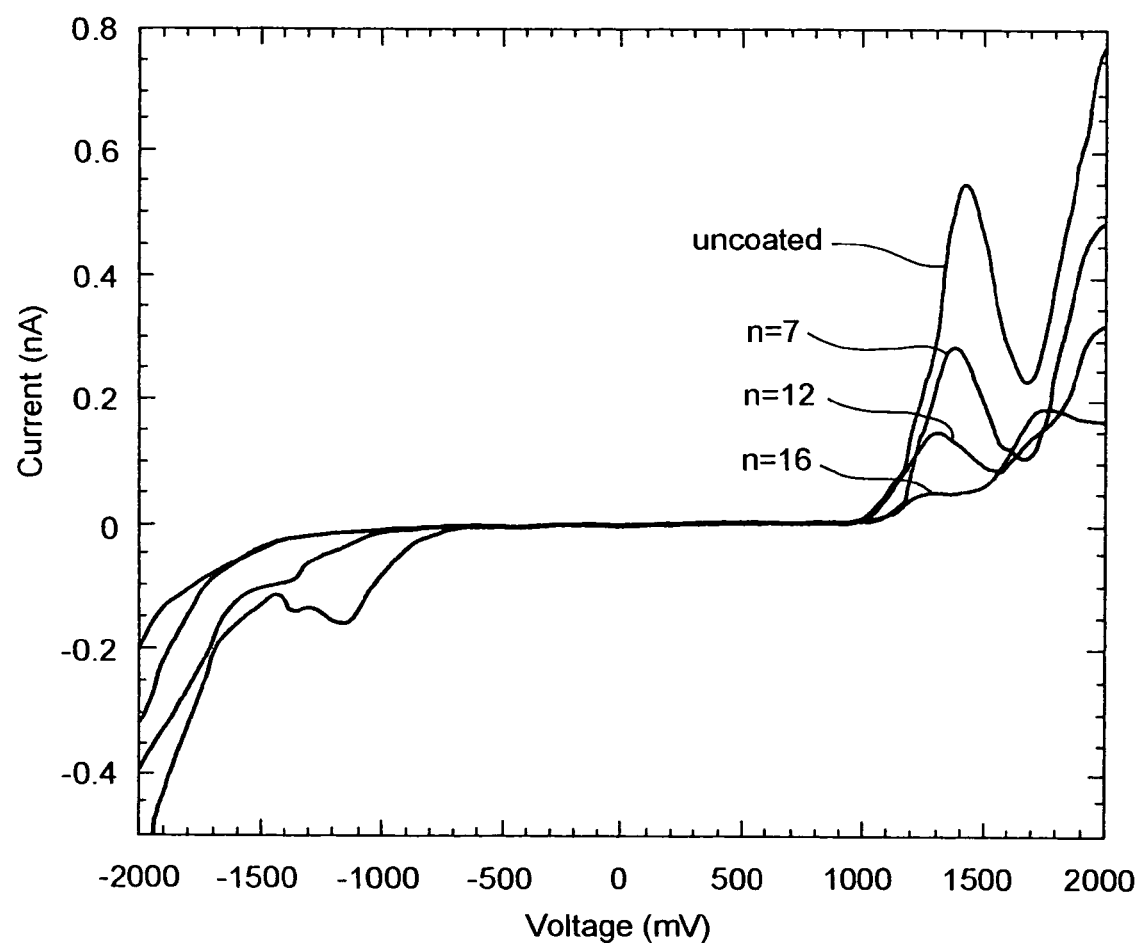
FIG. 13A is a plot depicting representative current-voltage curves measured on a Fc-thiolate SAM using an STM tip coated with the alkylthiol $CH_3(CH_2)_{n-1}SH$.
Figure 13B:
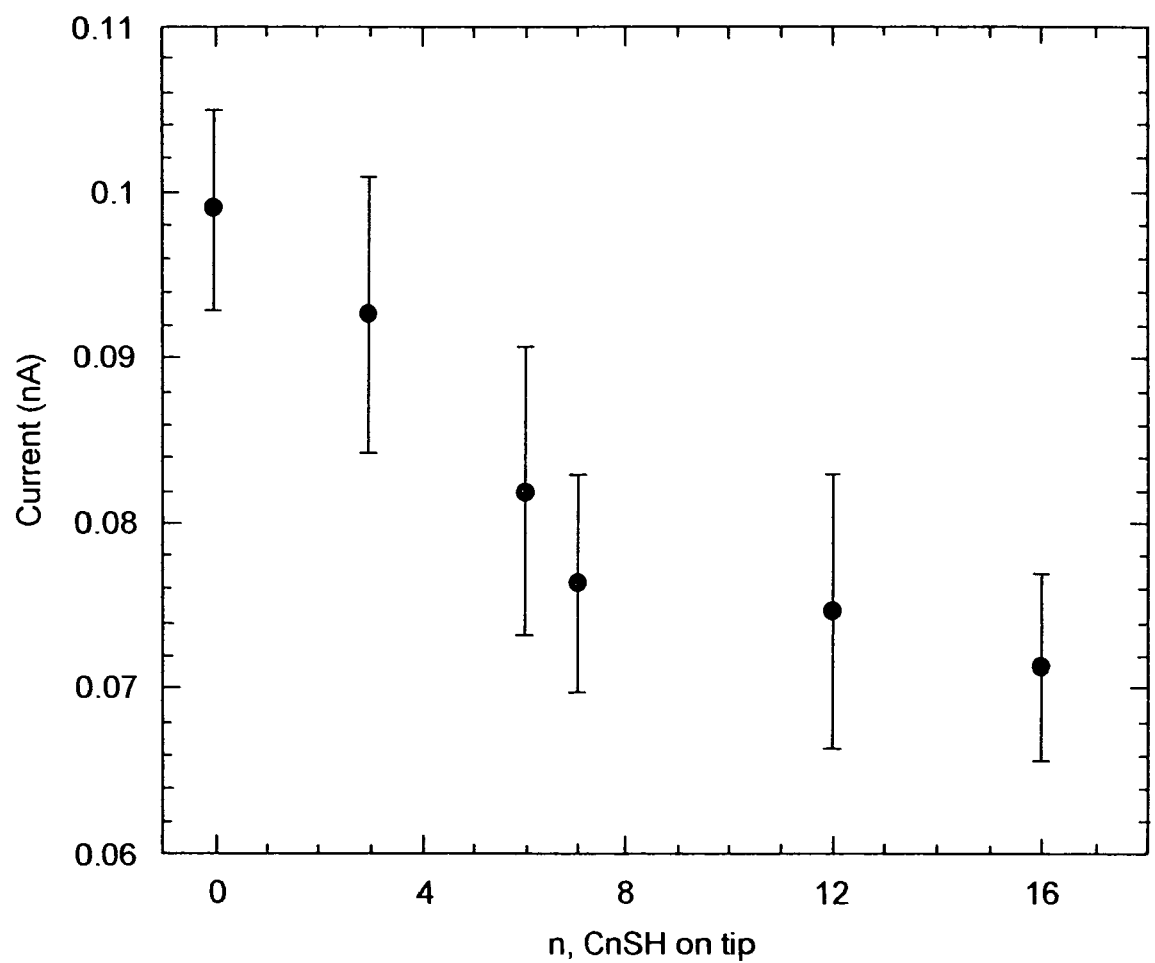
FIG. 13B is a plot depicting the average current values at the current peak as a function of the alkylthiol coating the tip.

FIGS. 13A and 13B depict an effect of coating an STM tip with a monolayer of material. Turning first to FIG. 13A, representative current-voltage curves of Fc-thiol are depicted. These curves were measured using STM tips coated with the material $CH_3(CH_2)_{n-1}S$—. The length of the monolayer material was altered, with n varying between 7 and 16 $CH_2$ groups. Turning next to FIG. 13B, a plot is presented that depicts the average current values at the current peak as a function of the alkylthiolate that coated the STM tip.

Thus, in another embodiment, a method of the present invention can further comprise modulating NDR in the NDR device. For example, an NDR device of the present invention can further comprise a second electrical contact comprising a semiconductor material or a conductor material. In this case it is preferable that the SAM is disposed between the substrate and the second electrical contact. In this embodiment, disposing a spacer moiety on the second electrical contact can modulate the NDR displayed by the device.

In this embodiment the spacer moiety comprises an alkane thiol. Optionally, the second electrical contact is a one of a metal contact, a STM tip, and/or an evaporated top contact. Optionally, the second electrical contact is one of a metallic proximal probe and a semi-conducting proximal probe, such as one of a conducting AFM tip and a STM tip.

Figure 14A:
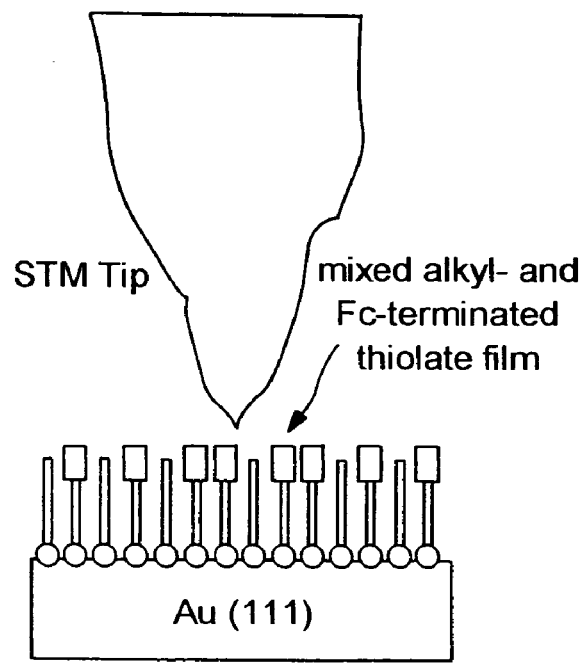
FIG. 14A is a structural schematic depicting a sample surface being probed by an STM tip. The Fc-terminated thiol is deposited on Au(111).

In yet another embodiment, modulating of the NDR is accomplished by contacting the electroactive moiety in the NDR device with a modulating moiety. In one embodiment, the contacting comprises contacting the NDR device with a solution comprising the modulator moiety. This concept is demonstrated in FIGS. 14A and 14B. In FIG. 14A, a surface is depicted that comprises a thiol film (i.e., spacers comprising a thiol group), some members of which are terminated with Fc, while others are terminated with unlabeled alkyl groups. No secondary structure is associated with the surface depicted in FIG. 14A.

Figure 14B:
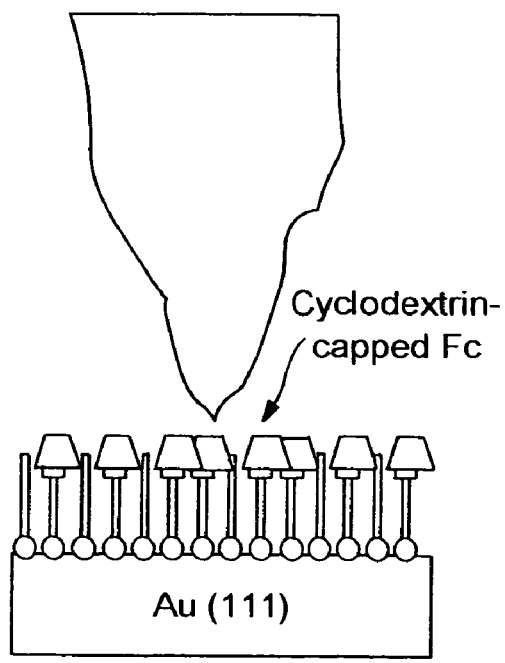
FIG. 14B is a structural schematic depicting a sample surface being probed by an STM tip. The Fc-terminated thiol SAM has been modified by exposure to beta-cyclodextrin (β-CD).

FIG. 14B, on the other hand, depicts the association of a cyclodextrin (interchangeably denoted CD and β-CD herein) with the Fc component of the surface of FIG. 14A. This association is analogous to the "host-guest" complexes commonly formed by cyclodextrins, and sometimes employed in drug delivery and other applications.

Figure 15A:
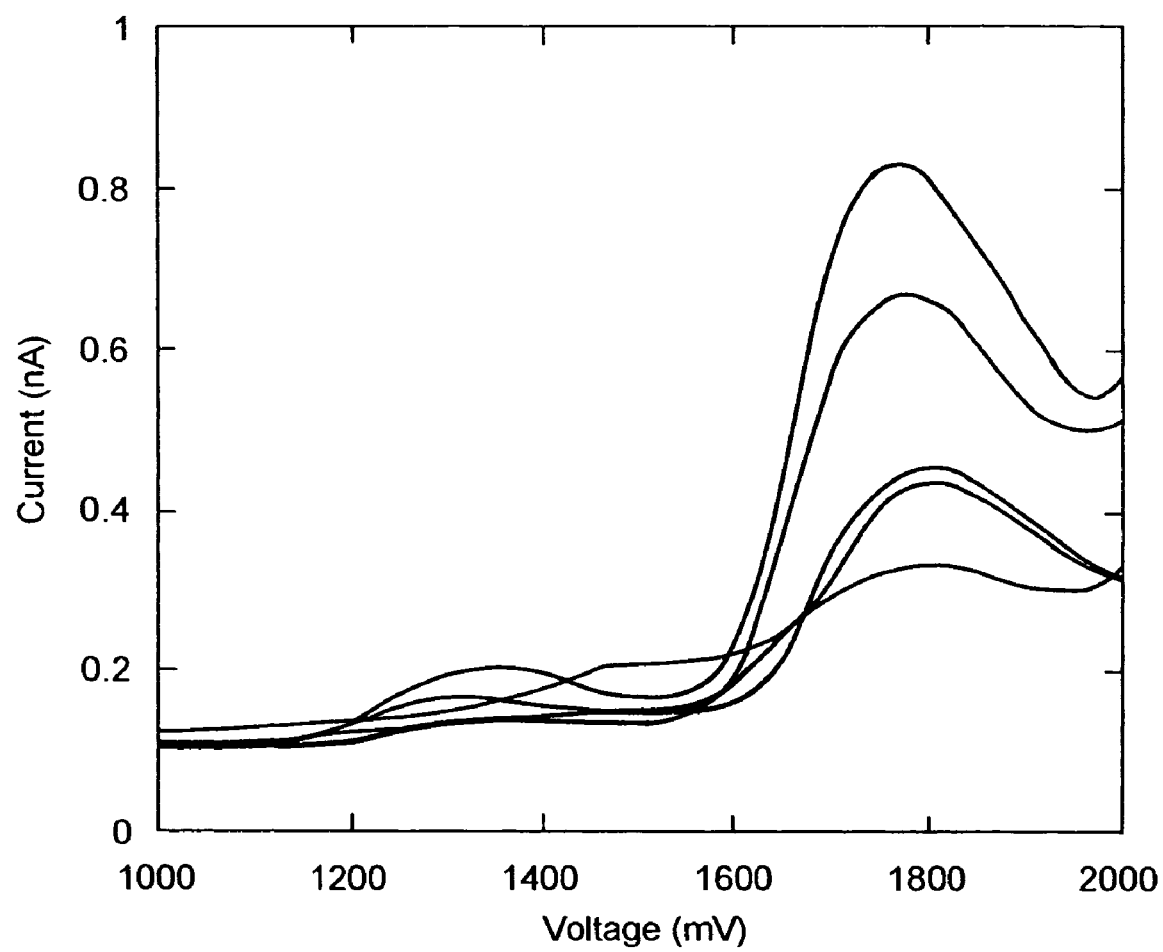
FIG. 15A is a plot depicting attenuation of the NDR properties in the I-V curves of Fc-thiol by the formation of Fc-cyclodextrin host-guest complexes.
Figure 15B:
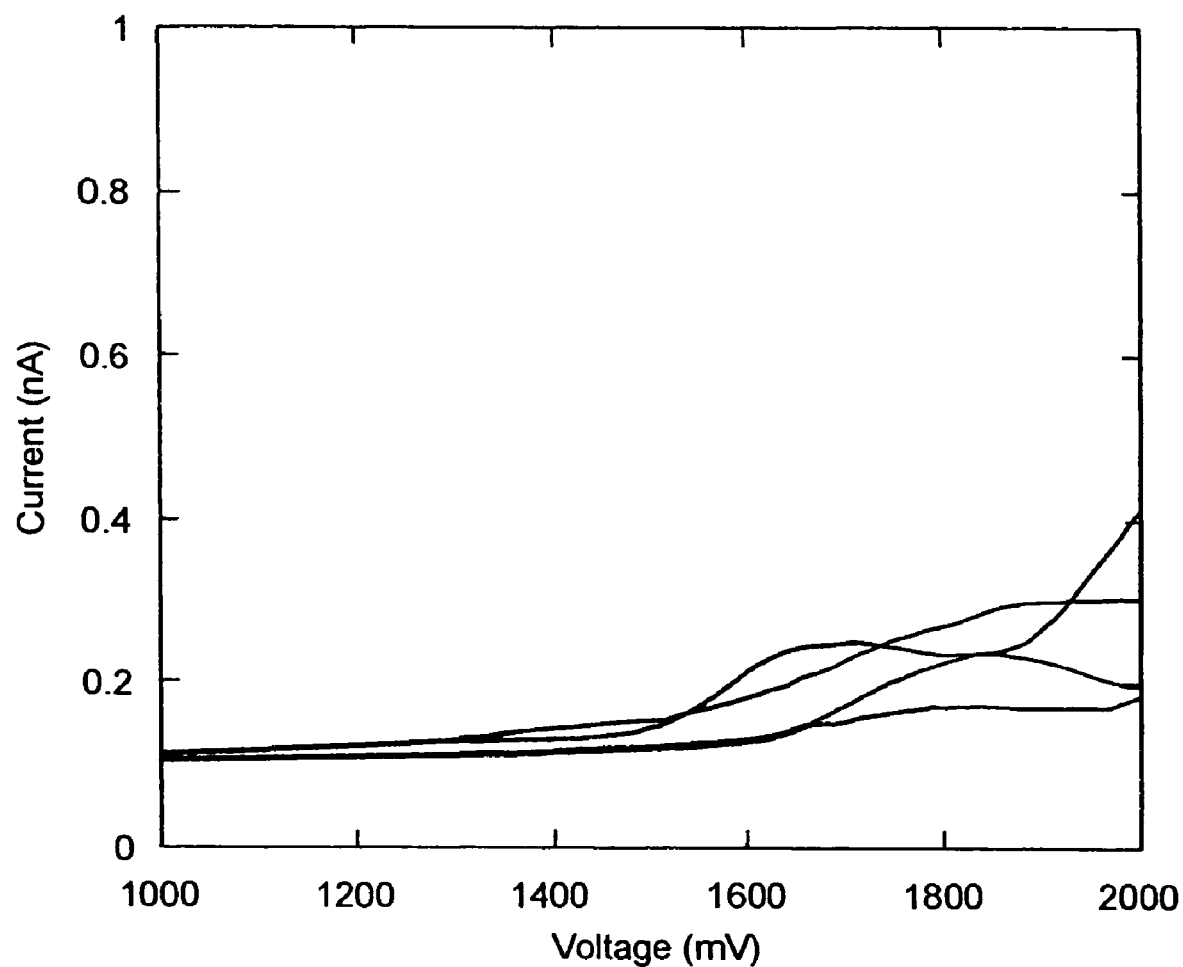
FIG. 15B is a plot depicting attenuation of the NDR properties in the I-V curves of Fc-thiol by the formation of Fc-cyclodextrin host-guest complexes.

FIGS. 15A and 15B depict the effect of the formation of these host-guest complexes on the NDR properties of the system. FIG. 15A is a current-voltage curve depicting NDR properties of the system in the absence of cyclodextrin, and thus, the absence of host-guest complexes. FIG. 15B, on the other hand, is a current-voltage curve that depicts the NDR properties of the system in the presence of cyclodextrin-containing host-guest complexes. FIG. 15B indicates that in the presence of cyclodextrin-containing host-guest complexes, NDR effects are attenuated.

In another embodiment, the NDR device exhibits two or more negative differential resistance peaks in the presence of a varying applied voltage. In one embodiment, this is accomplished by selection and preparation of a molecule-based SAM, or by the incorporation of multiple layers in a SAM. Thus, depending on the application of the particular NDR device (e.g., a resonant tunneling device), the peak-to-valley ratio (PVR) or the peak current level is optimized. A high peak-to-valley ratio allows the critical current signal to be not only above the noise level, but also above the level of a false signal such as that produced by thermal excitation. The advantages of a low peak current include lower power consumption due to the lower turn-on voltage and higher speed. In addition, as a general rule, the lower the current, the faster the switching time can be, since it takes less to time to reach the peak current.

A wide variety of responses have been observed in the I-V curves, so the PVR's observed in the Examples presented below and given here are comparative. Indeed, the PVR's are 2 (Fc, uncoated tip), 2.3 (Fc, $C_7SH$), 2 (Fc, $C_{12}SH$), and 1.2 (Fc, $C_{16}SH$). As a general note, a wide variation in the PVR of the NDR peaks was also observed, with the average PVR in a data set near one (1.1 to 1.5), due to the significant percentage of plateau-like responses in the data set. Even with these responses included, the PVR tends to decrease slightly with increasing alkythiol on the tip. Thus, NDR peak to valley ratio in a multilayered SAM-based device can be increased/decreased by increasing/decreasing the number of layers in the multilayered SAM. By way of additional example, see FIGS. 10 and 11.

The optimization and modeling of NDR behavior in semiconductors continues to be active field of study. Optimization methods include adjusting the doping levels in the semiconductors being used, so as to favorably achieve the desirable band-gap properties at the p-n junction interface. In a recent report, a high PVR value for a semiconductor system was reported as 85. Borgstrom et al., *Appl. Phys. Lett.* 78(21): 3232, 21 May 2001. Typical PVR values for conventional semiconductors are approximately 10. The highest PVR's observed in the methods and device of the present invention are about 5, which is remarkable for a room temperature organic system. In addition, much higher PVR's were observed in other organic systems.

Although it is not applicants' desire to be bound by any theory of operation, it is contemplated that the modulation is accomplished by effectively increasing the barrier in the device. Thus, modulation of NDR by increasing or decreasing the barrier in the NDR device comprises an aspect of the present invention.

VI. Molecular Electronic Components

Also provided are molecular electronics components that comprise a NDR device of the present invention. Representative molecular electronic components include memory cells, NDR devices comprising break junctions, NDR devices comprising as second electrical contact (including, but not limited to evaporated top contacts), and NDR devices comprising arrays comprising one of a nanotube, a nanowire, and both nanotube and nanowire.

A representative memory cell comprises a NDR device of the present invention as disclosed herein above and a switching component. A switching component is an art-recognized component in a memory cell device and is operatively interacted with an NDR device of the present invention in accordance with standard techniques.

An NDR device comprising break junction is also provided in accordance with the present invention. In one embodiment, the NDR device comprises: (a) a substrate comprising a conductor material or a semi-conductor material; (b) a self-assembled monolayer (SAM) disposed on the substrate, wherein the SAM comprises a first electroactive moiety and a spacer moiety, the spacer moiety defining a barrier between the electroactive moiety and the substrate; and (c) a second electrical contact comprising a conductor material or a semi-conductor material, wherein the substrate and the second electrical contact define a break junction. The NDR device exhibits negative differential resistance in the presence of a varying applied voltage and the SAM is sandwiched into the break junction.

An NDR device comprising a second electrical contact is also provided in accordance with the present invention. In one embodiment, the NDR device comprises: (a) a substrate comprising a conductor material or a semi-conductor material; (b) a self-assembled monolayer (SAM) disposed on the substrate, wherein the SAM comprises a first electroactive moiety and a spacer moiety, the spacer moiety defining a barrier between the electroactive moiety and the substrate; and (c) a second electrical contact comprising a semiconductor material or a conductor material. The NDR device exhibits negative differential resistance in the presence of a varying applied voltage and the SAM is disposed between the substrate and the second electrical contact. In one embodiment, the second electrical contact comprises an evaporated top contact.

An NDR device comprising one of a nanotube array and a nanowire array, or combination thereof, is also provided in accordance with the present invention. In one embodiment, the NDR device comprises: (a) a substrate comprising a conductor material or a semi-conductor material, the substrate defining a first structure comprising one of a nanotube, a nanowire, and both nanotube and nanowire; (b) a self-assembled monolayer (SAM) disposed on the substrate, wherein the SAM comprises a first electroactive moiety and a spacer moiety, the spacer moiety defining a barrier between the electroactive moiety and the substrate; and (c) a second electrical contact comprising a semiconductor material or a conductor material, the second electrical contact defining a second structure comprising one of a nanotube, a nanowire, and both nanotube and nanowire. Thus, the first and second structures can comprise a nanotube, a nanowire, or both a nanotube and nanowire, such a nanotube/nanowire combination. The NDR device exhibits negative differential resistance in the presence of a varying applied voltage and wherein the SAM is disposed between the first and second structures. In one embodiment, the SAM is disposed between the first and second structures in a crossed array. The crossed array can be one of a nanotube array, a nanowire array, and/or a nanotube/nanowire array. Thus, this device can employ nanotubes and/or any of several types of nanowires.

LABORATORY EXAMPLES

The following Laboratory Examples have been included to illustrate preferred modes of the invention. Certain aspects of the following Laboratory Examples are described in terms of techniques and procedures found or contemplated by the present inventors to work well in the practice of the invention. These Laboratory Examples are exemplified through the use of standard laboratory practices of the inventors. In light of the present disclosure and the general level of skill in the art, those of skill will appreciate that the following Laboratory Examples are intended to be exemplary only and that numerous changes, modifications and alterations can be employed without departing from the spirit and scope of the invention.

Materials and Methods for Laboratory Example 1

Materials

Ferrocenyl-undecanethioacetate (Uosaki et al., (1991) *Langmuir* 7: 1510-1514) and phenoxygalvinol-substituted hexanethioacetate (Shultz & Tew, (1994) *J. Org. Chem.* 59: 6159-6160) were prepared as described in the literature and were available from previous research. Dodecanethiol, hexadecanethiol, dodecane, and absolute ethanol were purchased from Sigma-Aldrich Corp. (St. Louis, Miss., United States of America) and used as received. Au(111) substrates were prepared as previously described (Gorman et al., (2000) *Langmuir* 16: 6312-6316). Briefly, gold wire is melted in a hydrogen flame to form a gold ball, followed by annealing the gold ball to produce large facets.

Monolayer Preparation

Thioacetates were dissolved in solution as described below, and ammonia gas was bubbled through solutions for 5 minutes, nominally to deprotect the thioacetate group with base. After the ammonia bubbling was discontinued, the solutions were purged with $N_2$ for about 5 minutes before use. Later experiments showed that monolayers with identical properties could be produced when the ammonia bubbling step was skipped. Further evidence for apparent in situ deprotection of alkyl thioacetate groups upon SAM formation has been provided (Roth et al., (2000) *J. Vac. Sci. Technol., B* 18: 2359-2364). Deprotection of the thioacetate group on the molecules to form the thiol prior to these experiments and use of the thiol derivative of the molecule directly was also employed. For single-component monolayers, 5 mM ethanol solutions were employed. For replacement lithography experiments, approximately 0.1 mM solutions of thiol in dodecane were employed. Single-component monolayers of the substituted thiols were prepared by immersion of the freshly annealed Au(111) substrate in the ethanolic solution for 12 hours. The substrates were then removed from the solution, rinsed in ethanol, and blown dry with filtered $N_2$. Samples were imaged immediately following preparation. Dodecanethiolate monolayers for patterning experiments were prepared on Au(111) by boiling the substrate in a 1 mM ethanolic solution for 1 hour or more and then allowing the solution and substrate to cool. Such a procedure has been shown to produce well-formed monolayers with large domains (Yamada et al., (2000) *Langmuir* 16: 5523-5525). The substrate was removed from the cooled solution, rinsed in ethanol, and blown dry with filtered $N_2$. Samples were imaged immediately following preparation.

Scanning Tunneling Lithography/Microscopy

Imaging, patterning, and CITS data collection were carried out on NANOSCOPE™ III and NANOSCOPE™ Multimode STMs (available from Digital Instruments, Santa Barbara, Calif., United States of America). The freshly prepared Au(111) substrates were mounted in a stainless steel and Kel-F fluid cell for imaging. Mechanically cut platinum-iridium alloy (Pt—Ir; 90:10) tips were used for all experiments. Imaging conditions (IC) were +1 V substrate bias, 5-10 pA tunneling current, and 0.5-1 Hz scan rate or a slight variation thereof, as noted. Patterning was carried out in approximately 0.1 mM dodecane solution, under humid (55-60%) nitrogen and ambient temperatures. Before each pattern was attempted, a series of parallel lines were substituted at different biases (in 0.1 V increments from +2.1 to +3.7 V, scan rate of 50 nm/sec) to determine the most effective patterning conditions (PC). The tip was then moved to another region of the sample to draw the patterns shown.

Once an area was chosen for patterning, it was imaged at imaging conditions (IC) before any patterning was carried out. The patterns were of two forms: squares and letters. Squares were formed by setting PC, then allowing the tip to scan in the same manner as image collection, and returning to IC at the end of the scan. Letters were designed in a lithographic script used by the NANOSCOPE™ STM to control tip position and tunneling conditions. Upon execution, the script changed to PC and moved the tip in the programmed manner, with no user intervention. Upon completion, IC were set, and the tip was returned to user control. Imaging of the patterned region was then carried out at IC.

Continuous imaging tunneling spectroscopy (CITS) was used to collect an array of 1024 I-V curves over a square region of the substrate. In this process, the tip was stopped periodically during the course of the image capture, the feedback of the setpoint current was disengaged, and a sweep of voltage was made while monitoring current. Such I-V curves occasionally showed variation in intensity from curve to curve and occasionally showed current responses out of the measurable range. These "aberrant data" were thought to be nominally due to either interaction between the tip and the surface or tip/surface contamination. An algorithm that discards these data was used in the analysis of these sets of curves. Aberrant curves were defined as those that show saturated current response at either positive or negative potentials. In addition, curves displaying no response to the voltage sweep were also removed from the data set. All curves retained were set to zero current at zero bias to account for internal offsets generated by the microscope. These internal offsets were verified to occur sometimes when the tip was well out of range of the sample, indicating that they are instrumental artifacts. The voltage at which NDR occurred was determined by derivatizing the I-V curve with a 5 point derivative. That is, for point n, a regression line was determined for points n−2, n−1, n, n+1, and n+2, and the slope of the regression line was recorded as the derivative of point n. This procedure had the additional advantage of minimizing the effects of noise on the curve. At positive potentials, the peak position was determined by the algorithm as the point at which slope goes from positive to negative, and at negative potentials, the reverse was true.

The voltage at this point was tabulated, and then all voltage values were binned to give a histogram representation of peak position (Kinne & Barteau, (2000) *Surf. Sci.* 447: 105-111; Han et al., (1997) *J. Phys. Chem. B* 101: 10719-10725). The voltage distribution was fit to a Gaussian curve, of the formula $$\text{Count} = A \exp\left[\frac{-(V - V_p)^2}{B^2}\right] + C$$

where $V_p$ is the peak voltage and B is related to the width at half-height, $\Delta V$, by $\Delta V = 1.175B$.

Soft Lithography/Microcontact Printing

A poly(dimethylsiloxane) stamp with a pattern of 2 μm lines with a 2 μm pitch was used for microcontact printing. The stamp was inked with an ethanolic solution of $C_{16}SH$, stamped, lifted, rotated 90°, and then stamped again. The Au(111) substrate was then immersed in an ethanolic solution of Fc-$C_{11}$SH for about 12 hours. The substrate was removed from the solution, rinsed in ethanol, blown dry with filtered $N_2$, and imaged immediately.

Laboratory Example 1

SAMs Containing Redox-Active Head Groups Display Molecular NDR

It was hypothesized that SAMs containing redox-active head groups could display molecular NDR. To test this, a ferrocenyl-undecanethiolate (Fc-$C_{11}$S—) SAM (Uosaki et al., (1991) *Langmuir*7: 1510-1514) was prepared on a Au(111) surface (Table 1 provides the structures of the molecules employed in Laboratory Examples 1-4). Using scanning tunneling microscopy (STM) under conditions of low setpoint current, a set of current-voltage (I-V) curves was obtained using continuous imaging tunneling spectroscopy (CITS). In this procedure, 1024 I-V curves were collected on a region of the surface. Although many investigations of molecular I-V behavior are performed under high vacuum conditions, these data were taken under an inert fluid (dodecane). The reasons for this experimental condition will be made clear when patterning experiments are described below. FIG. 1A shows a typical I-V curve from the CITS data set. A substantial NDR is apparent, particularly given that these data (and all data disclosed herein) were obtained at room temperature. As described further herein, similar experiments on nonelectroactive SAMs do not yield NDR behavior.

TABLE 1

Structures Employed in Laboratory Examples 1-4

| Abbreviation | Structure | Length, Å[a] |
|---|---|---|
| $C_{12}S$— | 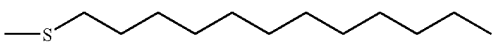 | 15.1 |
| Fc-$C_{11}$S— | 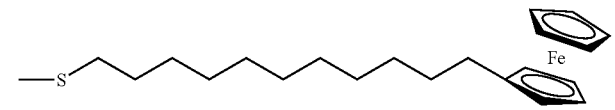 | 16.8 |
| Gal-$C_6$S— | 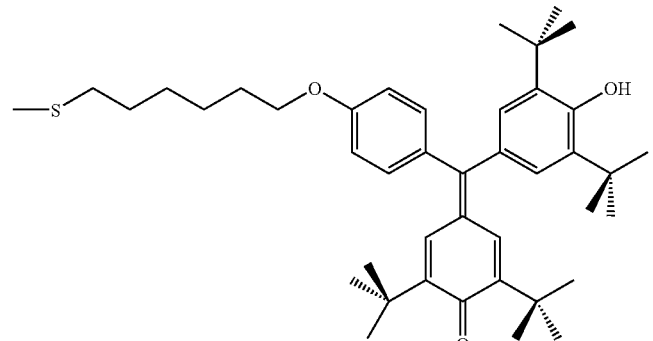 | 19.9 |
| $C_{16}S$— | 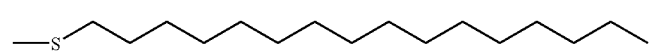 | 20.1 |

[a]From the sulfur atom to the end of the molecule as measured from molecular models.

Figure 1B:
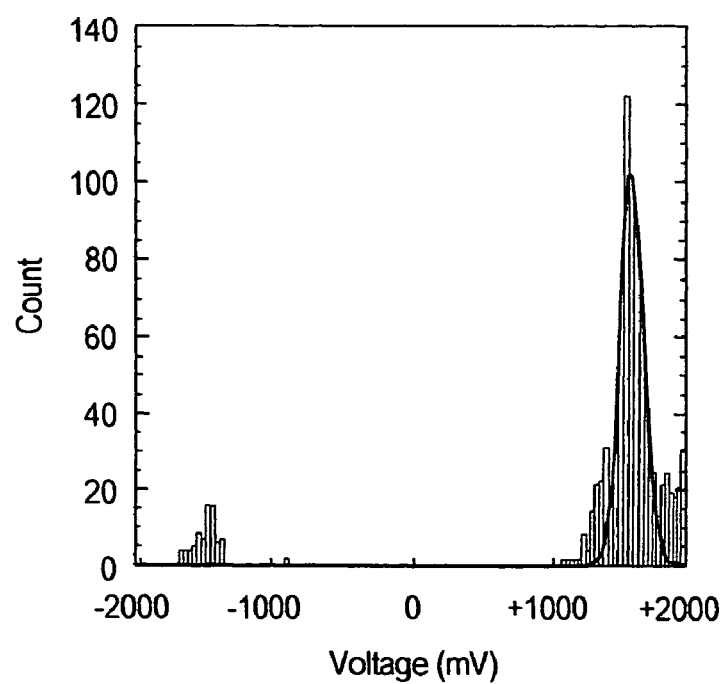
FIG. 1B is a histogram depicting the position of NDR in the Fc-$C_{11}$S-SAM under dodecane, including a best-fit to the Gaussian distribution.

It was noted that the applied bias at which the NDR occurs shifts somewhat across a data set. There are several possible reasons for this behavior. Most notably, the chemical environment across the SAM must vary somewhat, and this could slightly influence the position of NDR. Furthermore, artifacts were found in all CITS data sets. Thus, illustration of one I-V peak does not necessarily signify an experimentally valid NDR response. For these reasons, a statistical determination of the peak position was used. FIG. 1B shows a histogram of NDR peak position in one CITS data set of 1015 curves (nine were rejected as aberrant). Fitting this histogram to a Gaussian curve (as described herein), a peak maximum of 1.571 V (and peak width at half-maximum of 0.143 V) was determined as the position of NDR.

While the NDR response of the $Fc-C_{11}S$-SAM at positive bias was a dominant feature in the CITS data set, the NDR response at negative potentials was found to be intermittent. As the histogram in FIG. 1B shows, the number of curves showing NDR at negative potentials is about 10% of those displaying NDR at positive potentials. The reason for this behavior is unclear. However, one possibility could arise from the difference in the transconductance of the tip-SAM junction and the thiol-Au interface.

In an effort to evaluate the reproducibility of the NDR response from tip to tip, seven Pt—Ir tips were prepared and used in I-V experiments as described above. Since it is difficult to ascertain the quality of an STM tip by optical methods, the resolution of images collected with each tip was used to judge its relative sharpness. Sharp terraces and/or pit edges and individual bright spots on the surface (presumably molecules of the $Fc-C_{11}S$-SAM) were observed with six of the seven tips. In these six cases, NDR responses of similar magnitudes and positions to those indicated in FIGS. 1A and 1B were observed. The seventh tip imaged the surface dimensions very poorly but accurately measured step edge heights. Although these results do not unambiguously rule out surface or tip contamination, they are most likely due to a blunt tip. I-V curves obtained with this tip did not show the NDR response on a SAM that previously had shown NDR response. This behavior indicates that a sharp tip with a narrow local density of states is preferable for the observation of NDR in molecular systems and further indicates that such behavior can be observed more or less routinely.

The mechanism for NDR based on resonant tunneling can be illustrated using a model shown in FIGS. 2A-2E. Here, the relative current through a double tunnel junction containing a molecular resonant state is shown. The molecular resonant state is presumed to be accessible at relatively low applied potential; this low potential presumably correlates with an accessible potential in an electrochemical cell. FIGS. 2A-2E are drawn in a qualitative fashion for several reasons. First of all, the polarization of the molecule in the tip-substrate gap can be substantial, shifting the molecular states more or less than depicted (Xue et al., (1999) *Phys. Rev. B* 59: R7852-R7855). Also, it is assumed that the tip is very sharp, presenting a narrow local density of states (LDOS). The relative distribution of this LDOS is, however, unknown. Also important to this system is the double tunnel junction, with one tunnel barrier at the tip-SAM gap and the other tunnel barrier at the alkyl chain between the Fc head group and the Au substrate. The relative heights of these barriers are unlikely to be equal and are difficult to know quantitatively.

Figure 2:
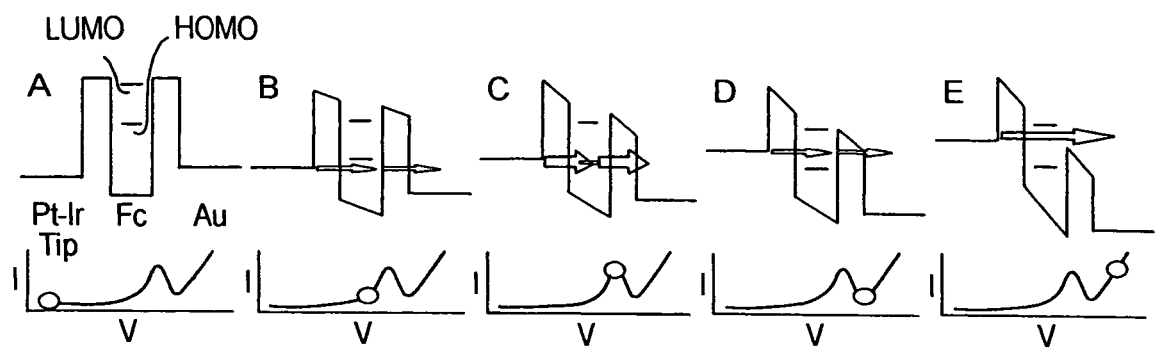
FIGS. 2A-2E are diagrams depicting a schematic model of NDR in the Fc-$C_{11}$S-SAM.

The diagrams in FIGS. 2A-2E can be interpreted as follows. In FIG. 2A, the highest occupied molecular orbital (HOMO) and lowest unoccupied molecular orbital (LUMO) of the Fc head group lie well above the Fermi energy of either the tip or the substrate. These relative positions were roughly estimated from solution voltammetry and the relation between a saturated calomel electrode and the vacuum (Kolb, (2001) *Angew. Chem., Int. Ed. Engl.* 40: 1162-1181). Upon positive bias of the Au substrate, the molecular states are shifted to a lesser degree than that of the Au substrate. As the system approaches a resonance between the tip and the molecule (FIG. 2B), any broadness present in the LDOS of the tip allows some overlap with the molecular states, allowing an increasing tunneling current, until the two are in resonance and the current reaches a maximum (FIG. 2C). Moving out of resonance, the current decreases (FIG. 2D), until the potential is large enough to allow thermionic emission (FIG. 2E). The thermionic emission should be dependent on both the tunnel barrier height and the temperature, and the tunnel barrier heights and position of the molecular states should influence the position of NDR.

NDR responses have also been observed at negative potentials as well as positive. Such a response is ascribed to an analogous model as that in FIGS. 2A-2E. As the potential is shifted to more negative potentials, the Au substrate approaches resonance with the Fc HOMO, eventually maximizing the current at full resonance.

Laboratory Example 2

Evaluation of Resonant Tunneling

Prior to the disclosure of the present invention presented herein, little experimental evidence has been available that differentiates resonant tunneling as the mechanism of NDR from that of adventitious oxidation/reduction of the electroactive species in the junction. In an attempt to rule out an electrochemical mechanism, I-V curves were collected at different voltage sweep rates varying well over a decade (six values from 2.3 to 60.0 V/s). In all cases, the magnitude and position of the NDR response were similar to those data shown in FIGS. 1A and 1B. If an electrochemical mechanism were operative (e.g., that found in thin layer voltammetry), one would expect to see an influence on the I-V behavior as this parameter was varied. This was not observed.

Assuming a resonant tunneling mechanism, the I-V response of a nonelectroactive SAM (in the present Laboratory Example, a dodecanethiolate SAM, $C_{12}S$-SAM, i.e. a SAM prepared by the exposure of dodecanethiol to the substrate) is not predicted to display a NDR response. This hypothesis was tested using patterned SAMs of ferrocene-terminated and methyl-terminated thiols. Use of patterned SAMs permits the direct contrast of the electronic properties of two different SAMs in the same experiment, under the same conditions. Moreover, this approach (which is illustrated schematically in FIGS. 3A-3C) also allows verification that the electronic properties of the electroactive regions of the patterned SAM are the same as those from single-component SAMs.

Figure 3A:
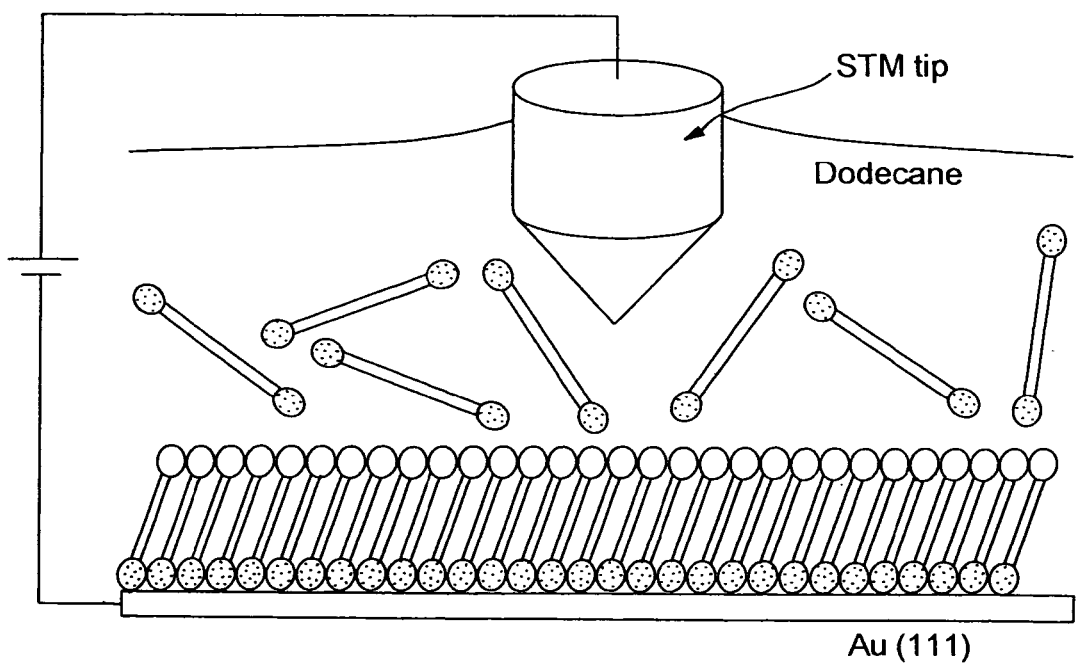
FIGS. 3A-3C are a schematic of scanning tunneling microscopy based lithography on SAMs, where
Figure 3B:
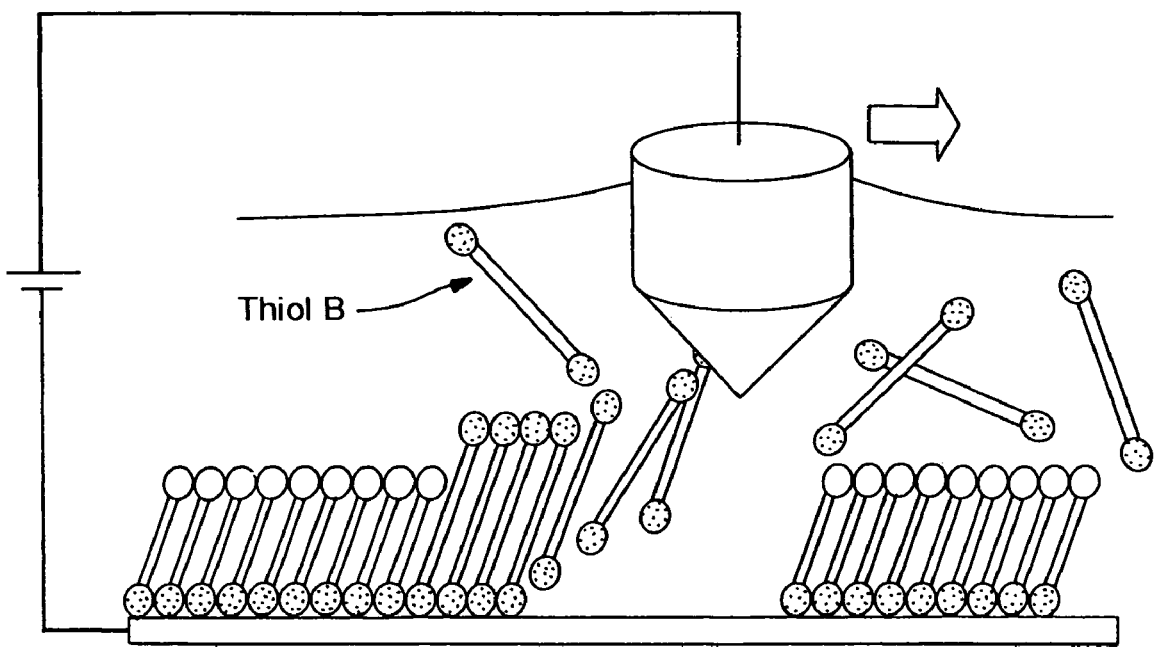
Figure 3C:
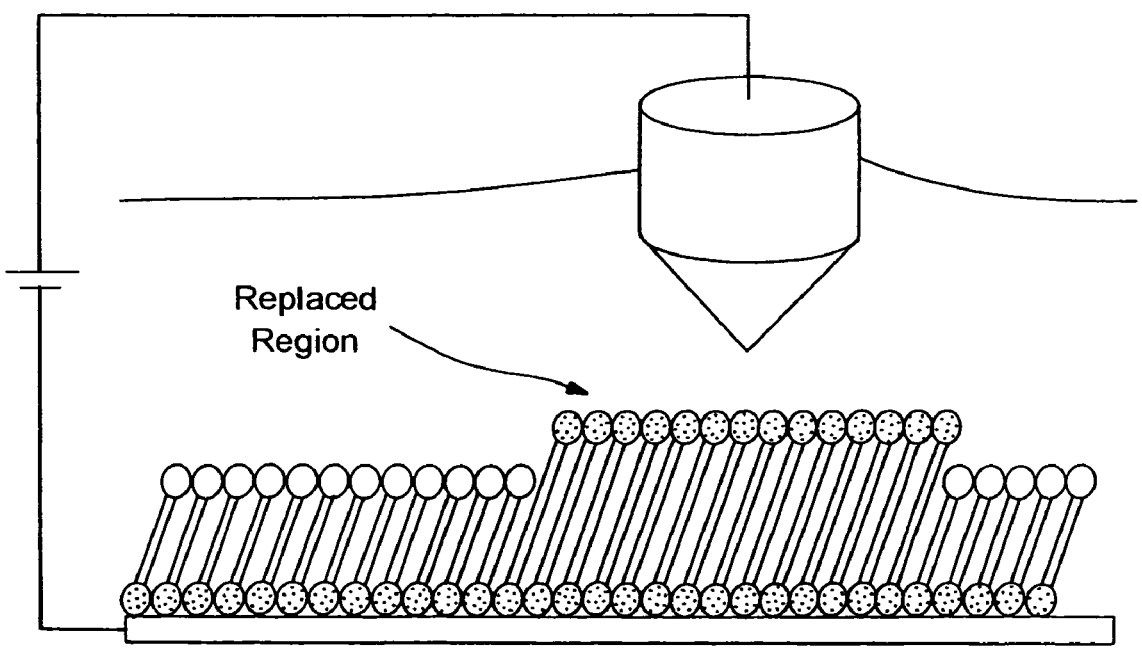

In FIG. 3A, one thiol forms a monolayer and is imaged under imaging conditions (IC) under a dodecane solution of a different thiol. In FIG. 3B, the bias, setpoint, and scan rate are set to patterning conditions (PC) and the tip traces a pattern. These conditions cause desorption of the thiol in the SAM, allowing the thiol in solution to form a monolayer in its place. In FIG. 3C, the resulting patterned SAM can be imaged at IC with no further patterning. Additionally, the solution can be exchanged for another thiol solution (to effect multicomponent or "two-color" replacement) (Gorman et al., (2000) *Langmuir* 16: 6312-6316) or clean dodecane (to minimize the likelihood of adventitious replacement) (Dunbar et al., (2000) *J. Phys. Chem. B* 104: 4880-4893; Bumm et al., (1999) *J. Am. Chem. Soc.* 121: 8017-8021).

Figure 4A:
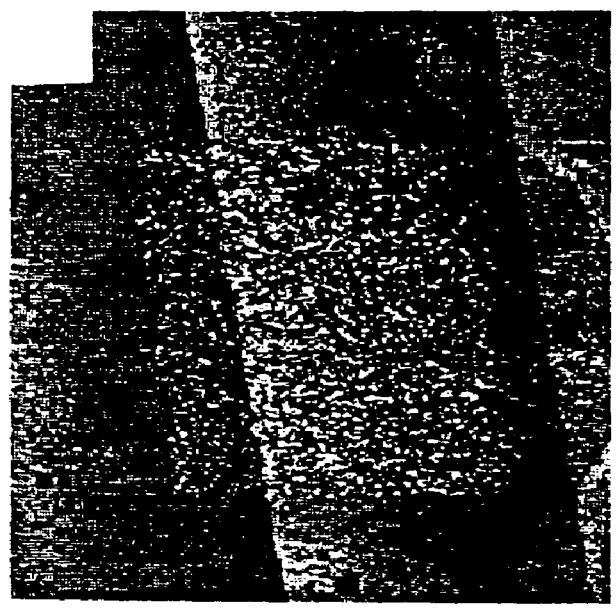
FIG. 4A is an STM image illustrating patterning of FC-$C_{11}$SH into a background of $C_{12}$S-SAM (700 nm scan size, with a 400 nm-replaced region. PC: 3.5 V, 5 pA, 0.5 Hz; IC: 1.0 V, 5 pA, 0.5 Hz, imaged under dodecane.

FIG. 4A illustrates a patterning of $Fc-C_{11}SH$ into a background $C_{12}S$-SAM. In this case, the patterning was carried out at PC as the tip scanned the substrate in the normal imaging manner, producing a square patterned region containing Fc-$C_{11}$S-SAM. The tip was retracted, and the Fc-$C_{11}$SH solution was replaced with clean dodecane (after rinsing the cell once with dodecane). The tip was re-engaged, the scan size was widened, and the patterned region was then examined at IC by CITS.

Figure 4B:
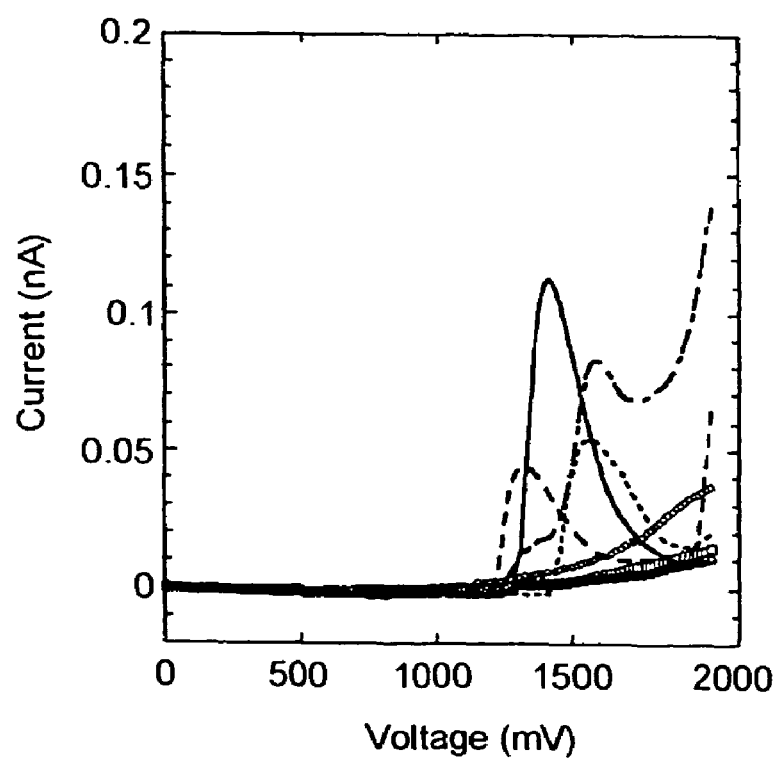
FIG. 4B is a graph depicting representative current-voltage (I-V) curves for Fc-$C_{11}$S-SAM (lines: solid, dashed-dotted, dashed, and dotted) replaced into $C_{12}$S-SAM (markers: circle, square, diamond, triangle).

FIG. 4B displays representative I-V curves obtained in each of the two regions. The lines in FIG. 4B are four exemplary I-V curves chosen from inside the patterned region (nominally Fc-$C_{11}$S-SAM). The open markers in FIG. 4B are four I-V curves chosen from outside the patterned region (nominally $C_{12}$S-SAM). The I-V curves of the Fc-$C_{11}$S-SAM region display NDR responses similar to those observed in the single-component monolayer, whereas the I-V curves from the $C_{12}$S-SAM region do not. Variation in peak potential and the relative magnitude of the NDR response can be observed and is expected given the discussion of the data shown in FIGS. 1A and 1B. These data indicate that the replacement lithography scheme shown in FIGS. 3A-3C can be employed to generate patterns of electroactive SAM and that electroactive regions retain an I-V behavior similar to those in the analogous single-component, electroactive SAMs.

In control experiments where another nonelectroactive thiol, mercapto-undecanoic acid [HS(CH$_2$)$_{10}$COOH], was used as the replacing thiol, a histogram of peaks in the I-V curves obtained in these regions showed little response. The occasional response observed in these data was attributed to signal artifacts. Thus, a well-sampled data set of electroactive SAM is clearly different from that of a nonelectroactive SAM.

Laboratory Example 3

Other Electroactive SAMs

Figure 5A:
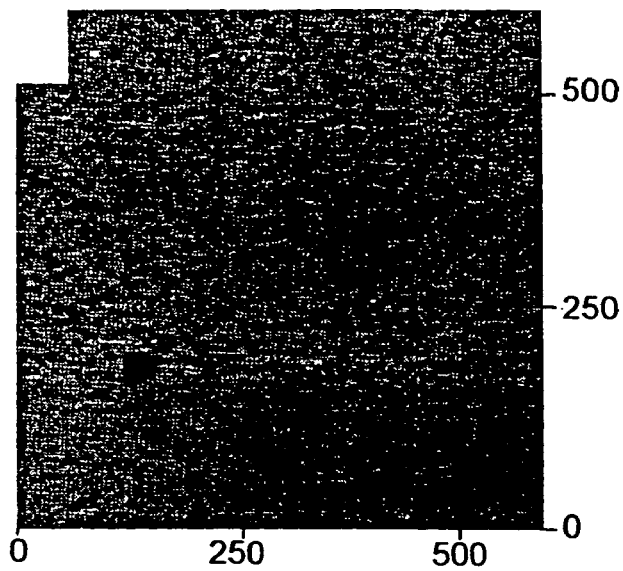
FIGS. 5A-5C depict apparent height difference of electroactive thiols at varying imaging biases under dodecane. The letters "Fc" were written with Fc-$C_{11}$SH, and the letters "Gal" were written with Gal-$C_6$SH. PC: 3.0 V, 10 pA, 50 nm/s; RH, 59%. IC: 600×600 nm, 3 nm z scale, 10 pA, 1 Hz scan rate. Imaging bias.
Figure 5B:
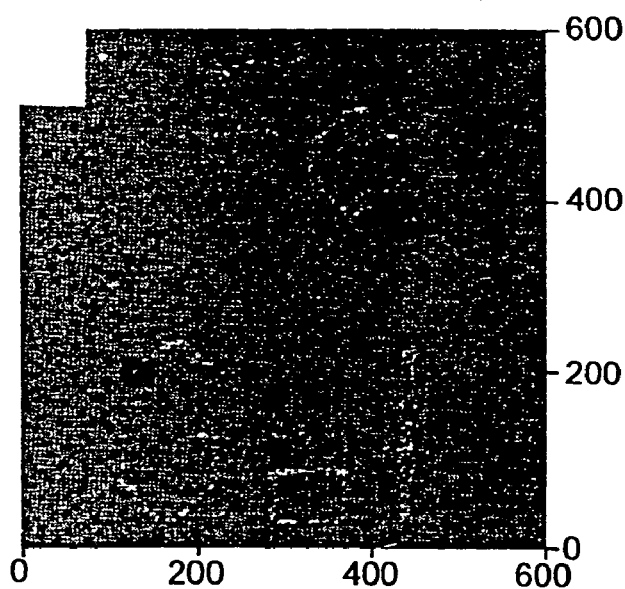
Figure 5C:
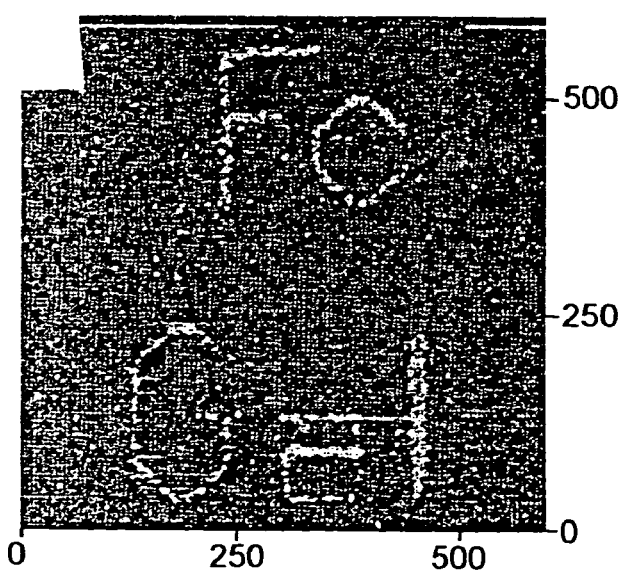
Figures 6A, 6B:
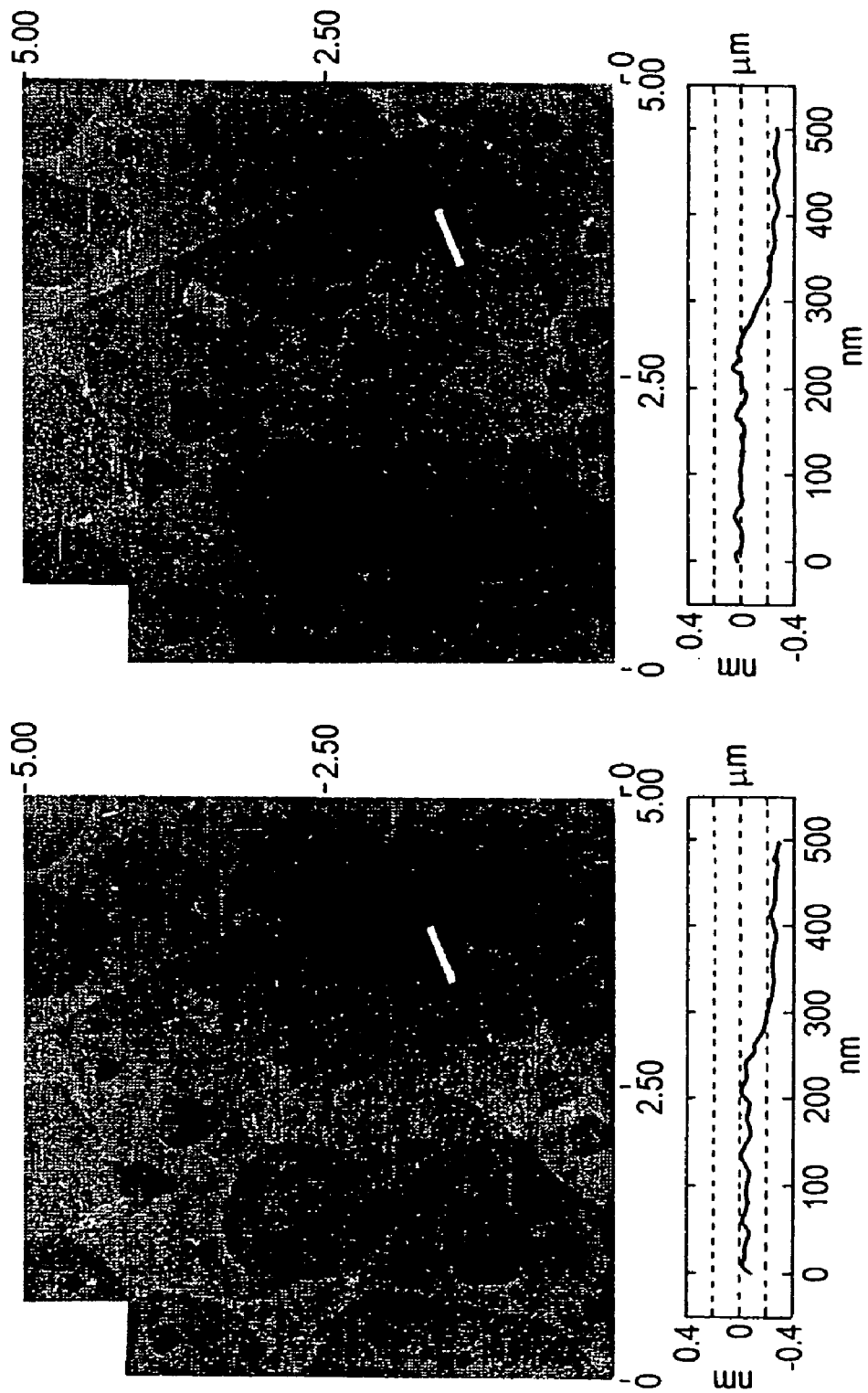

It was hypothesized that other electroactive SAMs would display an I-V response similar to that of the Fc-$C_{11}$S-SAM. To this end, scanning tunneling lithography was employed to place Fc-$C_{11}$S-SAM and a phenoxygalvinol-substituted hexanethiol (Gal-$C_6$S-SAM) (Shultz & Tew, (1994) *J. Org. Chem.*59: 6159-6160; Sagara et al., (1998) *Langmuir* 14: 3682-3690) adjacent to one another in a background of $C_{12}$S-SAM. FIGS. 5A-5C shows the results of one series of patterning of both the Fc-$C_{11}$S-SAM (as the letters "Fc") and the Gal-$C_6$S-SAM (as the letters "Gal") into a $C_{12}$S-SAM. The increased tunneling current through the electroactive SAM at biases near the position of NDR was observed as an increase in apparent height difference between an electroactive and a nonelectroactive SAM. At low bias (115 mV, FIG. 5A), the apparent height difference between the three SAM regions was extremely small, and the patterns of the electroactive SAMs were almost indistinguishable from the background $C_{12}$S-SAM. Examination of the I-V curves in FIG. 5B explains this observation, as there was little difference between the I-V response of the Fc-$C_{11}$S-SAM and $C_{12}$S-SAM regions at low bias.

As the imaging bias was increased (700 mV, FIG. 5B), the patterns became more apparent, and at the largest imaging bias (1800 mV, FIG. 17C), the apparent height difference grew still larger. Further increases in imaging bias were found to damage the patterned structure. The apparent height difference displayed by the Gal-$C_6$S-SAM was similar in magnitude and range to that of the Fc-$C_{11}$S-SAM. FIGS. 5A-5C indicate that the increased apparent height difference, presumably due to NDR (Tao, (1996) *J. Phys. Rev. Lett.* 76: 4066-4069), is persistent when electroactive molecules are incorporated into lithographically produced nanostructures.

Laboratory Example 4

Height Difference Between an Electroactive SAM And an Inert Background

The apparent height difference between an electroactive SAM and an inert background could be observed also on microcontact printed, patterned SAMs. To demonstrate this, microcontact printing (Xia & Whitesides, (1998) *Angew. Chem., Int. Ed. Engl.* 37: 550-575) was used to pattern a Au(111) substrate with hexadecanethiolate ($C_{18}$S—) SAM (i.e. a SAM prepared via the exposure of hexadecanethiol to gold) and Fc-$C_{11}$S-SAM. The stamp used in the microcontact printing consisted of 2 μm lines with a 2 μm pitch. The pattern was produced by stamping with $C_{16}$SH "ink" and then rotating the stamp by 90° and stamping again. The remaining, underivatized substrate (a series of squares) was filled with Fc-$C_{11}$S-SAM by subsequent incubation in a Fc-$C_{11}$SH solution.

FIGS. 6A-6D show the results of the patterning process at different imaging biases, over a 5 μm region. The heights versus position profiles shown underneath each image are an average of 20 line profiles across one edge of the patterned feature. The apparent height differences between $C_{16}$S-SAM regions and Fc-$C_{11}$S-SAM regions at different setpoint biases are given in Table 2. It was expected and observed that as the bias approaches the position of NDR, the apparent height difference (as the result of resonant versus non-resonant tunneling) between these two regions increases. On the basis of the different chain lengths of the two component molecules in the patterned SAM, the Fc-$C_{11}$S-SAM regions are shorter than the $C_{16}$S-SAM regions. The shorter Fc-$C_{11}$S-SAM regions are expected and found to appear slightly brighter (taller) than the physically taller $C_{16}$S-SAM regions in dodecane as the result of higher transconductance through the thinner monolayer. This is observed in the non-resonant region; there is an apparent height difference of approximately 2 Å between these two SAMs at +100 mV setpoint bias. As the bias approaches the position of NDR, this apparent height difference becomes much larger. The apparent height difference of 6 Å at +1500 mV applied bias indicates that the tunneling rate through the Fc-$C_{11}$S-SAM is at least $10^4$ times larger than that through the $C_{16}$S-SAM.

TABLE 2

Apparent Height Difference between $C_{16}$S-SAM and Fc-$C_{11}$S-SAM at Increasing Imaging Bias

| imaging bias, mV | apparent height difference, Å[a] |
|---|---|
| 100 | 2.0 ± 0.9 |
| 500 | 2.6 ± 0.9 |
| 1000 | 4.0 ± 1.0 |
| 1500 | 5.0 ± 2.0 |

[a]Error represents the magnitude of the 95% confidence intervals for a minimum of 12 height measurements.

Apparent height differences are highlighted in this microcontact printing experiment rather than direct depiction of the I-V properties of the different patterned regions. It was found that at very large length scales (and thus imaging scan rates), noise and imaging artifacts dominated the collection of I-V curves. This caused the majority of curves in a data set to be rejected by the protocol employed. Such artifacts are likely related to the increased distance over which the tip travels from curve to curve, increasing the chances that the tip would interact with the substrate and/or become fouled.

Figure 7A:
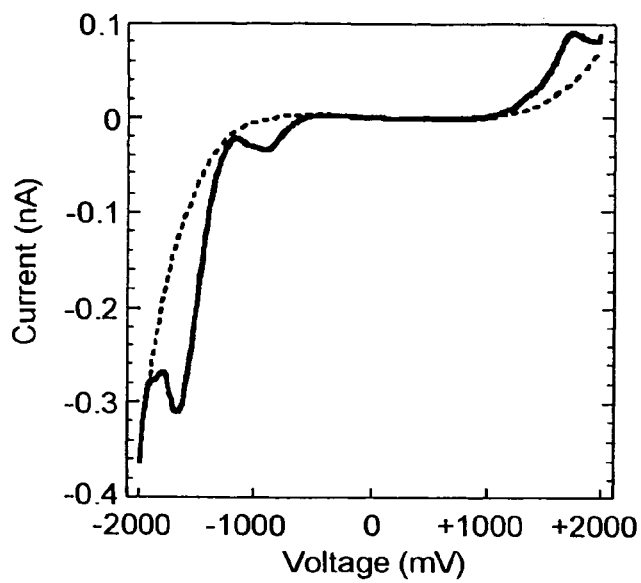
FIG. 7A is a graph of average current-voltage (I-V) curve of the Gal-$C_6$S-SAM in air (solid line) and under dodecane (dashed line).
Figure 7B:
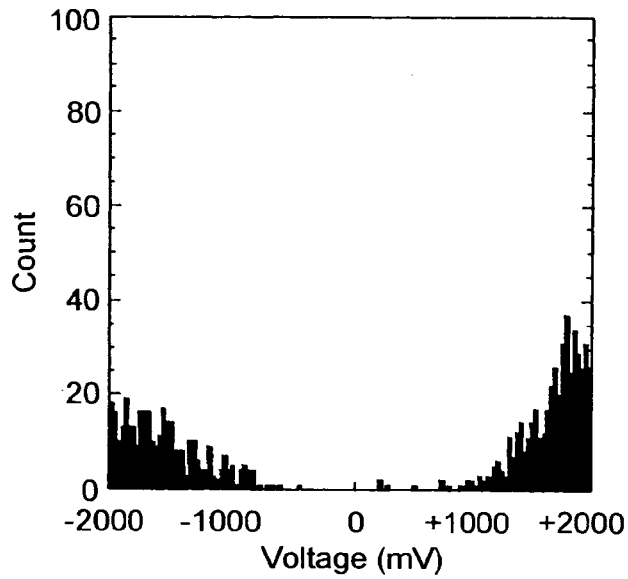
FIG. 7B is a histogram of the position of NDR across a Gal-$C_6$S-SAM in dodecane.
Figure 7C:
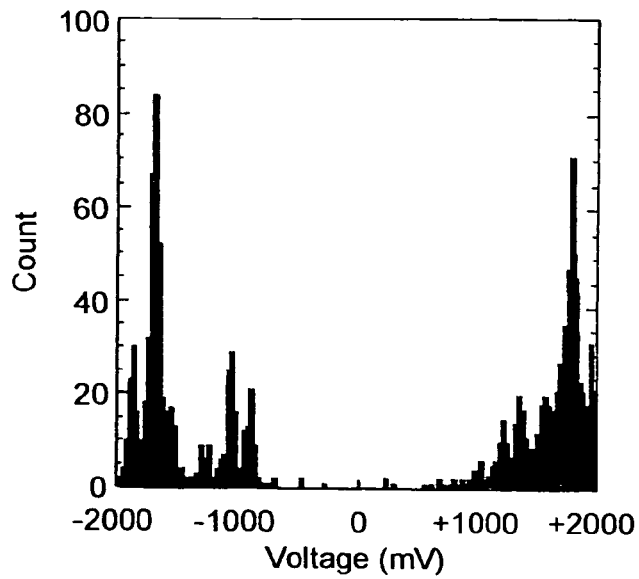
FIG. 7C is a histogram of the position of NDR across a Gal-$C_6$S-SAM in air.

To probe further the NDR behavior of the Gal-$C_6$S-SAM, a single-component Gal-$C_6$S-SAM was prepared on Au(111). FIGS. 7A-7C shows the results of CITS on this SAM substrate. In FIG. 7A, two curves are shown. The solid curve is an average of 540 curves from a CITS data set of 1024 collected in air. The NDR response is similar to that observed in FIGS. 1A-1C. Again, the existence of the peak in the I-V curve is the dominant feature highlighted here.

In FIG. 7A, the dashed curve is an average of 851 curves from a CITS data set of 1024 collected under dodecane. The average I-V curve of the Gal-$C_6$S-SAM in dodecane appears essentially featureless. This observation initially appears at variance with the data shown in FIGS. 5A-5C. However, it is rationalized by noting that the histogram of NDR peak positions taken in dodecane (FIG. 7B) shows relatively fewer counts and a larger variation in the position of any NDR than observed previously. Averaging a set of I-V curves in which the peak maximum shifts substantially produces a smooth featureless average I-V curve. Thus, from the data shown in FIG. 7B, it is concluded that NDR is observed in the dodecane environment, but with greater variability in peak position.

The more distinct NDR behavior observed in the average I-V response of the CITS data on the Gal-$C_6$S-SAM taken in air is likewise rationalized by examining the histogram of NDR peak positions in these data (FIG. 7C). In this set of data, a narrower distribution of peak positions and a greater count of responses are clearly observed. Given the narrower distribution of peak positions, it was expected and found that the average of these data shows a more pronounced response.

From a comparison of the data shown in FIGS. 7B and 7C, it is apparent that the local tip-sample environment plays a role both in the regularity with which NDR is observed on the Gal-$C_6$S-SAM and on the position of NDR. It is noted that neither the air nor the dodecane environment provides a definitive pH. Moreover, the I-V curves studied here involve passage of charge through rather than charge to the SAM as in an electrochemical experiment. However, the relative availability of water and/or protons might be important in this behavior. Despite some ambiguity on this point, it is nevertheless possible to conclude that the NDR response is related to the electroactive nature of the SAM head groups in both cases.

Summary of Laboratory Examples 1-4

Summarily, it has been shown that organothiolate SAMs (i.e. a SAM prepared with an organothiol) terminated with electroactive head groups (ferrocene and galvinol) displayed negative differential resistance behavior in the current-voltage response as measured in a tip/SAM/substrate junction. This response was equivalent in single-component SAMs and in patterned monolayers. Moreover, it has been demonstrated that scanning tunneling lithography can be employed to replace multiple thiols into an inert background SAM and that the electronic properties of the new thiol SAM could subsequently be measured using the same STM tip. Although molecular NDR has been observed previously, it is striking that it is observed here given the simplicity and ubiquitous nature of SAMs of electroactive thiols.

Materials and Methods for Laboratory Examples 5-8

Materials

Dodecane, β-cyclodextrin, and alkanethiols [$HS(CH_2)_{n-1}CH_3$; n=7, 12, 16] were purchased from Sigma-Aldrich Corp. (St. Louis, Miss., United States of America) and were used without further purification. Ferrocenylundecanethiol ($Fc(CH_2)_{11}SH$; abbreviated here as Fc) was prepared according to previously published procedures. Anhydrous ethanol (MPER Alcohol and Chemical Co., Shelbyville, Ky., United States of America) was used to dissolve alkanethiols. β-cyclodextrin was dissolved in high-purity water (MILLI-Q™ at 18 MΩ; Millipore, Bedford, Mass., United States of America).

SAM Preparation

Sample substrates were flame-annealed Au(111) facets on a gold bead formed at the end of a gold wire (99.999%; Alfa Aesar, Ward Hill, Mass., United States of America). The wire was alloyed to a Pt foil (Alfa Aesar, Ward Hill, Mass., United States of America) base. Prior to monolayer deposition the substrates were cleaned in piranha solution (3:1 v:v $H_2SO_4$:$H_2O_2$). Au(111) substrates were incubated in Fc solution for at least 24 hours at room temperature in a 1 mM ethanolic solution to form self-assembled monolayers (SAMs). After copious rinsing in ethanol, the sample holder was mounted in a homemade K-cel fluid cell in preparation for scanning.

Tip Coating With Thiols

Pt—Ir (90:10) tips (Alfa Aesar, Ward Hill, Mass., United States of America), 0.254 mm diameter, were mechanically cut. Au tips (99.995%; Alfa Aesar, Ward Hill, Mass., United States of America), 0.254 mm diameter, were also used. Prior to exposure to neat thiol they were dipped in piranha solution (3:1 $H_2SO_4$:$H_2O_2$) briefly, rinsed with absolute ethanol, and dried in a $N_2$ stream. The tips were held in place in a small volume of neat thiol and soaked overnight in ambient conditions. Prior to use the tips were rinsed in absolute ethanol and dried in a $N_2$ stream.

Scanning Tunneling Microscopy (STM)

All experiments employed a Digital Instruments (Santa Barbara, Calif., United States of America) NANOSCOPE™ IIIa and E (E-head) in low-current mode to obtain STM images at room temperature in ambient air. The sample substrate was placed in a custom-made fluid cell and immersed in a low dielectric scanning solvent, such as dodecane. Typical scanning conditions were a bias voltage of 1 V, a set-point current of 10 pA, and low integral and proportional gains of approximately 0.150. Any deviations from these conditions are noted in the figure captions of the corresponding figures.

Current-voltage curves were collected for these experiments using the CITS (Continuous Imaging Tunneling Spectroscopy) mode in the Digital Instruments scanning electronics. In low current mode, the current detection limits are −1 nA to +1 nA. In order to directly compare the current-voltage curves from different tips as reported herein, a data set was defined as 1024 current-voltage curves for each tip coating. At least three data sets were collected for each tip condition (uncoated, $C_7$SH-coated, $C_{12}$SH-coated, and $C_{16}$SH-coated) and sample condition (before and after β-cyclodextrin exposure). Each set comprises 1024 curves collected at regularly spaced intervals (32×32) when scanning a 200 nm by 200 nm region. During the collection of a current-voltage curve, the instrument stops lateral tip scanning and turns off feedback. The sweep time for each curve was 150 μs and the limits were −2 V to +2V.

CITS Data Analysis

Each data set was subject to a screening process where saturated responses were removed, as described for Examples 1-4 above. The peak currents and valley currents were determined by analyzing the first derivative of each I-V curve. These values were used to calculate a peak-to-valley ratio (PVR) for each peak, in order to isolate peaks that were not truncated by the limits of the scan. The calculated PVR and actual current value were used to sort peak data and the highest peak current values at a given voltage for each data set exhibited a combination of high PVR and peak current.

Procedure for CD Exposure

After scanning the Fc-SAM sample, dodecane was removed from the sample cell. The sample was rinsed in absolute ethanol and dried in an $N_2$ stream. The sample was then soaked in a 5 mM aqueous solution of β-cyclodextrin for one hour, rinsed in high-purity water, rinsed in copious amount of ethanol, dried in $N_2$, and immersed in dodecane for STM scanning.

Laboratory Example 5

NDR Modulation Using Coated Tips

To determine the effect of a barrier layer between the tip and the sample, STM tips coated with alkanethiols of different chain lengths were used to probe a Fc-SAM on gold. Pt—Ir and Au tips were positioned in a sample holder and coated with neat thiol by overnight deposition in solution at room temperature. Separate STM tips were coated with heptanethiol ($CH_3(CH_2)_6SH$ or $C_7SH$), dodecanethiol ($CH_3(CH_2)_{11}SH$ or $C_{12}SH$) or hexadecanethiol ($CH_3(CH_2)_{15}SH$ or $C_{16}SH$). FIG. 12A depicts an uncoated STM tip, while FIG. 12B depicts a coated STM tip. From the results to be presented, it was assumed that the thiol formed a SAM on the STM tip. The attenuation of STM-detected current was predicted.

Current-voltage (I-V) curves of Fc-terminated alkylthiolate were obtained using alkylthiolate-coated tips and compared to I-V curves obtained using an uncoated tip and are depicted in FIGS. 13A and 13B. FIG. 13A depicts current-voltage curves measured by employing coated STM tips. FIG. 13B illustrates the effect of spacer length on the current peak. Substantial variation was observed across a set of I-V curves. However, viewing highest responses across a given data set, a systematic decrease in the peak value of the observed NDR was observed as the chain length of the thiol on the tip was increased. Specifically, the current at the NDR peak maximum (at about 1400 mV) was observed to decrease with increasing length of the alkylthiolate (or tunneling barrier) on the tip, with an uncoated tip yielding the largest peak current value. These results indicate that the length of the alkylthiolate on the STM tip modifies the magnitude of the NDR peak.

In the tip-molecule-substrate system described in this Example, the tip-molecule barrier remains the same, but the barrier between the tip and molecule increases. Increasing the tunnel barrier width between the tip and molecule decreases the tunneling probability (the wavefunction overlap) between the two parts of the system. Thus, the electrons are less likely to tunnel from the molecule to the tip as the barrier width increases.

In this Example, another measure of the attenuation of NDR with molecules of increasing length on the tip is the decrease of the response within a given data set. Four histograms of peak voltage position for the uncoated, $C_7SH$—, $C_{12}SH$—, and $C_{16}SH$-coated tips were generated. In general, the count of I-V curves (from one data set containing 1024 curves) exhibiting a peaked response was observed to decrease with increasing chain length of the alkanethiol on the tip. Peak currents were predominantly found centered at −1350 mV and +1400 mV, although not necessarily in the same curve. Assuming one peak per curve would lead to an overestimate in the number of peaks. However, as noted above in the Materials and Methods discussion, peaks that appeared to extend past the voltage window were excluded from this set as well, leading to an underestimate in the number of peaks observed. Given these two competing factors, the response measured by the uncoated tip in this data set included 676 peaks, approximately 66% of the curves (assuming one peak per curve). The response measured by the coated tips were as follows: 389 peaks for the $C_7SH$ tip (38%), 206 peaks for $C_{12}SH$ tip (20%) and 176 peaks for the $C_{16}SH$ tip (17%).

As discussed in more detail in the Materials and Methods above, one can imagine a number of non-ideal factors that prevent the same I-V curve from being observed in each case. But clearly here, a nominally bigger tunnel barrier due to a longer thiol on the tip correlates with a decreased frequency of NDR across a sample.

Further, alkanethiols, which are non-electroactive molecules, do not exhibit NDR response. The increased current observed as the I-V scan reaches its positive and negative limits occurs as a result of thermionic emission, not resonant tunneling. So, while many curves in each set showed no NDR response, strong response indicated tip interaction with the ferrocene. By isolating the responses yielding the highest peak current values for each data set, NDR behavior resulting from the optimum tip-sample configuration for tunneling is measured. The large number of samples per scanning area (1024 per 200 nm×200 nm area) afforded the opportunity to view a variety of responses across the sample. The highest peak current values from each data set are representative of one extreme of a broad range of responses.

Laboratory Example 6

NDR Modulation Via Host-Guest Complexation

Having established the attenuation of NDR in Fc using a blocking SAM layer on the STM probe tip, studies were performed to explore the attenuation of NDR using host-guest complexation. β-Cyclodextrin is known to form a 1:1 host-guest inclusion complex with ferrocenyl head groups in SAMs. Ju & Leech, (1998), *Langmuir* 14: 300-306; Isnin et al., (1991) *J. Org. Chem.* 56: 35-41; McCormack et al., (1992) *Electrochim. Acta* 37: 1939-1944; Suzuki et al., (1993) *Bull. Chem. Soc. Japan* 66: 1472-1481; Matsue et al., (1985) *J. Am. Chem. Soc.* 107: 3411-3417; Szejtli, (1998) *Chem. Rev.* 98: 1743-1753. The association of cyclodextrins with Fc-terminated thioalkyls is depicted in FIGS. 14A and 14B. This complexation attenuates the rate of electron transfer to the ferrocenyl head group. In an electrochemical experiment, this attenuation essentially prevents any current flow due to oxidation of these encapsulated ferrocenyl groups. In the STM experiment reported here, the process is not the same as electrochemical oxidation, and, predictably, the results correlate with but do not exactly parallel the electrochemical results.

Thus, it was hypothesized that reduction in the electron transfer rate due to the capping of the ferrocenyl groups with β-cyclodextrin would result in a decrease in the magnitude of the observed NDR. After scanning an unmodified Fc-SAM, this sample was soaked in an aqueous solution containing β-cyclodextrin, rinsed, and I-V curves were obtained by STM. Representative current-voltage plots are shown in FIGS. 15A and 15B.

The I-V response of the Fc-SAM was compared before and after exposure to β-cyclodextrin solution. Following this exposure the I-V behavior of the film exhibited a marked attenuation in peak current, particularly in the peak centered about 1400 mV. The attenuation is similar to that observed when measuring I-V curves through an alkylthiolate monolayer on the STM probe tip. This behavior is consistent with an increased tunnel barrier due to the binding of the cyclodextrin to the ferrocenyl groups.

Attenuation in the frequency of NDR peaks in the cyclodextrin-exposed Fc-SAM compared to unexposed Fc-SAM was also observed. The number of peaks observed before exposure was 1782 from three data sets (3×1024 curves), approximately 58%, assuming one peak per curve. The number of peaks observed after cyclodextrin exposure was 1253 (41%). Although the number of peaks did not decrease as much as in the tip-coating experiments disclosed herein above, it is apparent that the magnitude of the peaks decreases. From these two results, it was concluded that cyclodextrin complexation serves to create a bigger tunnel barrier and thus a slightly decreased frequency of NDR across a sample. In addition, the complexation of Fc with cyclodextrin has altered the distribution of the voltage position of the peak current. The most frequent peak is now the peak centered at about 1770 mV. This result indicates a way to shift the position of the predominant NDR response, although the absolute current value of the peak at 1770 mV is still relatively low.

Summary of Laboratory Examples 5-6

In Examples 5-6 above, substantial variation in the I-V behavior across a sample was observed. This variation includes variation in peak position, variation in relative intensity and, in many cases, whether a peak was observed at all in an I-V trace. This variation is also discussed in Laboratory Examples 1-4 above. Particularly in the context of this work, it seems appropriate to indicate the several non-idealities in the STM-based I-V measurement that might contribute to this variation. The following discussion is presented to provide additional guidance to one of ordinary skill in the art in the practice of the present invention and should not be construed as limiting to the practice of the present invention in any way.

Variation in the peak voltage position and magnitude of NDR was observed. Several reasons that could contribute to this variation can be proposed. First, this system is a two-terminal system (substrate and tip), and as such, a chemical reference (e.g., a third, reference electrode) was not employed. Thus, there could be potential drift across the sample and during the course of an experiment.

Second, there could be differences across a data set in the conformation any of the molecular species employed. The term "conformation" can be interpreted broadly here and might include the conformation of the alkyl chain in the Fc-SAM, the orientation of the ferrocenyl head group, the cyclodextrin, and the alkyl chains on the tip (which quite possibly might be more disordered near the apex due to its hopefully high radius of curvature).

Third, the manner in which the tip interacts with the molecules could vary across a data set. This variation could encompass differences in the force between the tip and the molecules (thus possibly influencing conformation), and the physical size of the area being probed may be a factor in fluctuating I-V response as well. It is suspected that the act of scanning the tip over a SAM influences its conformation and order—this perturbation would also prove to contribute to structural variation and uncertainty in this experiment.

Fourth, although this experiment ideally probes the response of a single molecule due to the distance dependence of the STM tunneling current, the electronic properties of several molecules might be sampled at the same time.

Fifth, the role of contaminants—both on the tip and sample—is unknown. Although no substrate experiment can be performed in an environment that is guaranteed to be completely clean, these experiments were performed in ambient atmosphere. These conditions could exacerbate the issue of cleanliness. However, it is important to study these systems at room temperature and in ambient atmosphere. The use of molecules as elements in electronics is partially dependent on ease of use, in conjunction with performance.

An STM-based I-V measurement does have several important advantages. First, compared to the fabrication of metal-molecule-metal devices, it is much more rapid and convenient. In establishing molecular structure-property relationships, such a technique provides an excellent screening tool. Secondly, a good tip for imaging has a reduced density of electronic states at its apex, and this reduced density of states in at least one of the metal contact is preferred to observe NDR via a resonant tunneling mechanism. Third, since thousands of I-V curves can be collected, some indication of variation in behavior is possible. Several of the potential concerns expressed above are equally valid for other types of molecule-based I-V measurements. Statistical accounting of the variations in I-V behaviors of molecule-based junctions is absent for most other efforts in this field, particularly those in which devices are fabricated. Substantial variation in molecule-based devices could thus be a relatively general observation.

Ultimately, however, even in view of the above-noted concerns, the present invention establishes that the incremental attenuation of NDR behavior in electroactive monolayers at room temperature can be accomplished. Using a method previously demonstrated in metal-monolayer-metal systems to affect tunneling barriers, the principle of increasing thiol chain length to control tunnel barrier in a tip-molecule-substrate system is provided. In addition to modifying the probe tip, host-guest chemistry to produce the same effect is also provided. These data support the conclusion that the magnitude of NDR decreases with increasing tunnel barrier.

REFERENCES

The references listed below as well as all references cited in the specification are incorporated herein by reference to the extent that they supplement, explain, provide a background for or teach methodology, techniques and/or compositions employed herein.

Broekaert et al., *IEEE J. Solid-State Circuits* 33, pp.1342-1348 (1998).

Brown, J. and Pohm, A., *IEEE Trans on Comp, Pack and Manufact Techn. A,* 17(3), pp.373 (1994).

Chen, J.; Reed, M. A.; Rawlett, A. M.; Tour, J. M. "Large On-Off Ratios and Negative Differential Resistance in a Molecular Electronic Device" Science 1999, 286, 1550-1552.

Chen, J.; Wang, W.; Reed, M. A.; Rawlett, A. M.; Price, D. W.; Tour, J. M. "Room-temperature negative differential resistance in nanoscale molecular-junctions" Appl. Phys. Lett. 2000, 77,1224-1226.

Gaudioso, J.; Lauhon, L. J.; Ho, W. "Vibrationally Mediated Negative Differential Resistance in a Single Molecule" Phys. Rev. Lett. 2000, 85, 1918-1921.

Holmlin, E. E.; Haag, R.; Chabinyc, M. L.; Ismagilov, R. F.; Cohen, A. E.; Rampi, M. A.; Terfort, A.; Whitesides, G. M. "Electron Transport through Thin Organic Films in Metal-Insulator-Metal Junctions Based on Self-Assembled Monolayers" J. Am. Chem. Soc. 2001, 123, 5075-5085.

Huang, C. Y.; Morris, J. E.; Su, Y. K.; Kuo, T. H. "New method of modelling a multipeak resonant tunneling diode" Elect. Lett. 1994, 30, 1012-1 013.

Isnin, R.; Salem, C.; Kaifer, A. E. "Bimodal Cyclodextrin Complexation of Ferrocene Derivatives Containing n-Alkyl Chains of Varying Length"J. Org. Chem. 1991, 56, 3541.

Ju, H.; Leech, D. "Host-Guest Interaction at a Self-Assembled Monolayer/Solution Interface: An Electrochemical Analysis of the Inclusion of 11-(Ferrocenylcarbonyloxy)undecanethiol by Cyclodextrins"Langmuir 1998, 14, 300-306.

Kaba, M. S.; Song, I. K.; Barteau, M. A. "Investigation of framework and cation substitutions in Keggin-type heteropoly acids probed by scanning tunneling microscopy and tunneling spectroscopy" J. Vac. Sci. Technol. A 1997, 15, 1299-1304.

Karzazi, Y.; Cornil, J.; Bredas, J. L. "Negative Differential Resistance Behavior in Conjugated Molecular Wires Incorporating Spaces: A Quantum-Chemical Description" J. Am. Chem. Soc. 2001, 124, 3516-3517.

Kinne, M.; Barteau, M. A. "STM and TS investigations of silver polyoxometalate monolayers: model compounds and potential multifunctional oxidation catalysts" Surf. Sci. 2000, 447, 105-111.

Leonard, F.; Tersoff, J. "Negative Differential Resistance in Nanotube Devices" Phys. Rev. Lett. 2000, 85, 4767-4770.

Mathews, R. H.; Sage, J. P.; Sollner, T. C. L. G.; Calawa, S. D.; Chen, C.-L.; Mahoney, L. J.; Maki, P. A.; Molvar, K. M. "A New RTD-FET Logic Family" Proc. IEEE 1999, 87, 596-605.

Matsue, T.; Evans, D. H.; Osa, T.; Kobayashi, N. "Electron-Transfer Reactions Associated with Host-Guest Complexation. Oxidation of Ferrocenecarboxylic Acid in the Presence of b-Cyclodextrin"J. Am. Chem. Soc. 1985,107,3411-3417.

McCormack, S.; Russell, N. R.; Cassidy, J. F. "Cyclic Voltammetry of Ferrocene Carboxylic Acid Cyclodextrin Inclusion Complexes"Electrochim. Acta 1992, 37,1939-1944.

Mizuta, H. and T. Tanoue, "The Physics and Applications of Resonant Tunnelling Diodes", CUP (1995).

Schulman, J. N.; Santos, H. J. D. L.; Chow, D. H. "Physics-Based RTD Current-Voltage Equation" IEEE Elect. Dev. Lett. 1996, 17, 220-222.

Seabaugh, A.; Hu, Z.; Liu, Q.; Rink, D.; Wang, J. "Silicon-Based Tunnel Diodes and Integrated Circuits" In 4th International Workshop on Quantum Functional Devices; Research and Development Association for Future Electron Devices: Japan, 2000, pp 5-8.

Sun, J. P.; Haddad, G. I.; Mazumder, P.; Schulman, J. N. "Resonant Tunneling Diodes: Models and Properties"Proceedings of the IEEE 1998, 86, 641-661.

Suzuki, I.; Chen, Q.; Ueno, A.; Osa, T. "Ferrocene-Appended Cyclodextrins. The Effects of Temperature, Organic Solvent, Length of Spacer, and Cavity Size on the Complexation Behavior"Bull. Chem. Soc. Japan 1993, 66,1472-1481.

Sze, S. M. Physics of Semiconductor Devices; 2nd ed.; John Wiley and Sons: New York, 1981; pp 513-520.

Szejtli, J. "Introduction and General Overview of Cyclodextrin Chemistry"Chem. Rev. 1998, 98,1743-1753.

Tao, N. J. "Probing Potential-Tuned Resonant Tunneling through Redox Molecules with Scanning Tunneling Microscopy" Phys. Rev. Lett. 1996, 76, 4066-4069.

Umeda et al., "SCFL static frequency divider using InAlAs/InGaAs/InP HEMTs" in Proc. 25th European Microwave Conference pp. 222-228 (1995).

Van der Wagt et al., IEEE Elec. Dev. Lett. 19, 7 (1998).

Watanabe et al., Tech. Dig. IEDM 92, pp. 475-478 (1992).

Williamson, W., et al. "12 GHz clocked operation of ultralow power interband resonant tunneling diode pipelined logic gates" IEEE J. Solid State Circuits 32(2), pp. 222-231 (1997).

Wold, D. J.; Frisbie, C. D. "Fabrication and Characterization of Metal-Molecule-Metal Junctions by Conducting Probe Atomic Force Microscopy" J. Am. Chem., Soc. 2001, 123, 5549-5556

Wold, D. J.; Frisbie, C. D. "Formation of Metal-Molecule-Metal Tunnel Junctions: Microcontacts to Alkanethiol Monolayers with a Conducting AFM Tip" J. Am. Chem. Soc. 2000, 122, 2970-2971.

Xue, Y.; Datta, S.; Hong, S.; Reifenberger, R.; Henderson, J. I.; Kubiak, C. P. "Negative difference resistance in the scanning-tunneling spectroscopy of organic molecules" Phys. Rev. B 1999, 59, R7852-7855.

Xue, Y.; Datta, S.; Ratner, M. A. "Charge transfer and "band lineup" in molecular electronic devices: A chemical and numerical interpretation" J. Chem. Phys. 2001, 115, 4292-4299.

Zeng, C.; Wang, H.; Wang, B.; Yang, J.; Hou, J. G. "Negative differential-resistance device involving two C60 molecules" Appl. Phys. Lett. 2000, 77, 3595-3597.

Zhao, P.; Cui, H. L.; Woolard, D. L.; Jensen, K. L.; Buot, F. A. "Equivalent Circuit Parameters of Resonant Tunneling Diodes Extracted from Self-Consistent Wigner-Poisson Simulation" IEEE Trans. Elect. Dev. 2001, 48, 614-627.

Zhao, P.; Cui, H. L.; Woolard, D.; Jensen, K. L.; Buot, F. A. "Simulation of resonant tunneling structures: Origin of the I-V hysteresis and plateau-like structure" J. Appl. Phys. 2000, 87, 1337-1349.

It will be understood that various details of the invention may be changed without departing from the scope of the invention. Furthermore, the foregoing description is for the purpose of illustration only, and not for the purpose of limitation—the invention being defined by the claims.

What is claimed is:

1. A negative differential resistance (NDR) device comprising:
    (a) a substrate comprising a conductor material or a semiconductor material; and
    (b) a self-assembled monolayer (SAM) disposed on the substrate, wherein the SAM comprises a first electroactive moiety, a linker moiety, and a spacer moiety, the spacer moiety interposed between and defining a tunnel barrier between the electroactive moiety and the substrate and the linker moiety linking the substrate and the spacer moiety, wherein the linker moiety is selected from the group consisting of a thiol, an isocyanide, a carboxylic acid, a sulfonic acid, a phosphonic acid, a hydroxamic acid, an alcohol, an amine, a monochlorosilane, a dichlorosilane, a trichlorosilane, a monoalkoxysilane, a dialkoxysilane, and a trialkoxysilane, (c) wherein the NDR device exhibits negative differential resistance in the presence of a varying applied voltage.

2. The NDR device of claim 1, wherein the conductor material is selected from the group consisting of gold, silver, copper, nickel, platinum, palladium, indium tin oxide and yttrium-barium-copper oxide.

3. The NDR device of claim 1, wherein the semiconductor material is selected from the group consisting of silicon, germanium, a III-V semiconductor, and a II-VI semiconductor.

4. The NDR device of claim 1, wherein the electroactive moiety is selected from the group consisting of ferrocene; galvinol; an electroactive coordination compound of copper (I), copper (II) or combinations thereof; an electroactive coordination compound of iron (II), iron (III) or combinations thereof; viologen and its derivatives; a quinine; an anthroquinone; a cyanine; a porphyrin; a meso-substituted porphyrin; a beta-substituted porphyrin; a multi porphyrin array; a bipyridyl complex of ruthenium, osmium, iron, cobalt, and nickel, or combinations thereof; a phenanthroline complex of ruthenium, osmium, iron, cobalt, nickel or combinations thereof; a cyanide complex of iron, molybdenum, iridium, cobalt or combinations thereof; and a salen complex of manganese, nickel, cobalt, or combinations thereof.

5. The NDR device of claim 1, wherein the spacer moiety is a branched or straight chain alkyl of 1-20 carbon atoms, a branched or straight chain alkenyl of 1-20 carbon atoms, a branched or straight chain alkynyl of 1-20 carbon atoms, and substituted versions thereof.

6. The NDR device of claim 1, wherein the SAM further comprises a second linker moiety that links the electroactive moiety to the spacer moiety.

7. The NDR device of claim 6, wherein the first and second linkers are the same.

8. The NDR device of claim 6, wherein the second linker is selected from the group consisting of a thiol, an isocyanide, a carboxylic acid, a sulfonic acid, a phosphonic acid, a hydroxamic acid, an alcohol, an amine, a monochlorosilane, a dichlorosilane, a trichlorosilane, a monoalkoxysilane, a dialkoxysilane, and a trialkoxysilane.

9. The NDR device of claim 1, wherein the electroactive moiety is distributed within the SAM in a predetermined pattern.

10. The NDR device of claim 1, wherein the SAM further comprises a second electroactive moiety, the second electroactive moiety having a different NDR characteristic from the first electroactive moiety.

11. The NDR device of claim 10, wherein the first and second electroactive moieties are distributed within the SAM in a predetermined pattern.

12. The NDR device of claim 1, wherein the NDR device exhibits two or more negative differential resistance peaks in the presence of a varying applied voltage.

13. The NDR device of claim 1, wherein the SAM further comprises one or more additional electroactive moieties and one or more additional spacer moieties, wherein the electroactive moieties and the spacer moieties are the same or different, and wherein the one or more additional spacer moieties interconnect the one or more additional electroactive moieties to the first electroactive moiety and to themselves to provide a multilayered SAM.

14. The NDR device of claim 13, further comprising a second electrical contact comprising a semiconductor material or a conductor material, wherein the SAM is disposed between the substrate and the second electrical contact.

15. The NDR device of claim 13, further comprising disposing a spacer moiety on the second electrical contact.

16. The NDR device of claim 13, wherein the spacer moiety is an alkane thiol.

17. The NDR device of claim 13, wherein the second electrical contact is a metal contact.

18. The NDR device of claim 13, wherein the second electrical contact is a STM tip.

19. The NDR device of claim 13, wherein the second electrical contact comprises an evaporated top contact.

20. The NDR device of claim 13, further comprising a linker moiety that interconnects the spacer moieties and electroactive moieties.

21. The NDR device of claim 13, wherein the NDR device exhibits two or more negative differential resistance peaks in the presence of a varying applied voltage.

22. The NDR device of claim 13, wherein the NDR device displays a NDR peak to valley ratio associated with the number of layers in the multilayered SAM.

23. The NDR device of claim 1, further comprising a second electrical contact comprising a semiconductor material or a conductor material, wherein the SAM is disposed between the substrate and the second electrical contact.

24. The NDR device of claim 23, further comprising disposing a spacer moiety on the second electrical contact.

25. The NDR device of claim 23, wherein the spacer moiety is an alkane thiol.

26. The NDR device of claim 24, wherein the second electrical contact is a metal contact.

27. The NDR device of claim 24, wherein the second electrical contact is one of a metallic proximal probe and a semi-conducting proximal probe.

28. The NDR device of claim 24, wherein the second electrical contact comprises an evaporated top contact.

29. A method of preparing an NDR device, the method comprising:
  (a) providing a substrate comprising a conductor material or a semiconductor material; and
  (b) disposing on the substrate a self-assembled monolayer (SAM) wherein the SAM comprises an electroactive moiety, a linker moiety, and a spacer moiety, the spacer moiety interposed between and defining a tunnel barrier between the electroactive moiety and the substrate and the linker moiety linking the substrate and the spacer moiety, wherein the linker moiety is selected from the group consisting of a thiol, an isocyanide, a carboxylic acid, a sulfonic acid, a phosphonic acid, a hydroxamic acid, an alcohol, an amine, a monochlorosilane, a dichlorosilane, a trichlorosilane, a monoalkoxysilane, a dialkoxysilane, and a trialkoxysilane, to thereby prepare an NDR device that exhibits NDR in the presence of a varying applied voltage.

30. The method of claim 29, wherein the conductor material is selected from the group consisting of gold, silver, copper, nickel, platinum, palladium, indium tin oxide and yttrium-barium-copper oxide.

31. The method of claim 29, wherein the semiconductor material is selected from the group consisting of silicon, germanium, a III-V semiconductor, and a II-VI semiconductor.

32. The method of claim 29, wherein the electroactive moiety is selected from the group consisting of ferrocene; galvinol; an electroactive coordination compound of copper (I), copper (II) or combinations thereof; an electroactive coordination compound of iron (II), iron (III) or combinations thereof; viologen and its derivatives; a quinine; an anthroquinone; a cyanine; a porphyrin; a meso-substituted porphyrin; a beta-substituted porphyrin; a multi porphyrin array; a bipyridyl complex of ruthenium, osmium, iron, cobalt, and nickel, or combinations thereof; a phenanthroline complex of ruthenium, osmium, iron, cobalt, nickel or combinations thereof; a cyanide complex of iron, molybdenum, iridium, cobalt or combinations thereof; and a salen complex of manganese, nickel, cobalt, or combinations thereof.

33. The method of claim 29, wherein the spacer moiety is a branched or straight chain alkyl of 1-20 carbon atoms, a branched or straight chain alkenyl of 1-20 carbon atoms, a branched or straight chain alkynyl of 1-20 carbon atoms, and substituted versions thereof.

34. The method of claim 29, wherein the SAM further comprises a second linker moiety that links the electroactive moiety to the spacer moiety.

35. The method of claim 34, wherein the first and second linkers are the same.

36. The method of claim 34, wherein the second linker is selected from the group consisting of a thiol, an isocyanide, a carboxylic acid, a sulfonic acid, a phosphonic acid, a hydroxamic acid, an alcohol, an amine, a monochlorosilane, a dichlorosilane, a trichlorosilane, a monoalkoxysilane, a dialkoxysilane, and a trialkoxysilane.

37. The method of claim 29, wherein the electroactive moiety is distributed within the SAM in a predetermined pattern.

38. The method of claim 29, wherein the SAM further comprises a second electroactive moiety, the second electroactive moiety having a different NDR characteristic from the first electroactive moiety.

39. The method of claim 38, wherein the first and second electroactive moieties are distributed within the SAM in a predetermined pattern.

40. The method of claim 29, wherein the SAM further comprises one or more additional electroactive moieties and one or more additional spacer moieties, wherein the electroactive moieties and the spacer moieties are the same or different, and wherein the one or more additional spacer moieties interconnect the one or more additional electroactive moieties to the first electroactive moiety and to themselves to provide a multilayered SAM.

41. The method of claim 40, further comprising a linker moiety that interconnects the spacer moieties and electroactive moieties.

42. The method of either of claims 29 or 40, wherein the NDR device exhibits two or more negative differential resistance peaks in the presence of a varying applied voltage.

43. The method of claim 40, wherein the NDR device displays a NDR peak to valley ratio associated with the number of layers in the multilayered SAM.

44. The method of either of claims 29 or 40, further comprising providing a second electrical contact comprising a semiconductor material or a conductor material, wherein the SAM is disposed between the substrate and the second electrical contact.

45. The method of claim 44, further comprising disposing a spacer moiety on the second electrical contact.

46. The method of claim 44, wherein the spacer moiety is an alkane thiol.

47. The method of claim 44, wherein the second electrical contact is a metal contact.

48. The method of claim 44, wherein the second electrical contact is one of a metallic proximal probe and a semi-conducting proximal probe.

49. The method of claim 44, wherein the second electrical contact comprises an evaporated top contact.

50. A method of generating negative differential resistance, the method comprising:
(a) providing an NDR device comprising:
(i) a substrate comprising a conductor material or a semiconductor material; and
(ii) a self-assembled monolayer (SAM) disposed on the substrate, wherein the SAM comprises an electroactive moiety, a linker moiety, and a spacer moiety, the spacer moiety interposed between and defining a tunnel barrier between the electroactive moiety and the substrate and the linker moiety linking the substrate and the spacer moiety, wherein the linker moiety is selected from the group consisting of a thiol, an isocyanide, a carboxylic acid, a sulfonic acid, a phosphonic acid, a hydroxamic acid, an alcohol, an amine, a monochlorosilane, a dichlorosilane, a trichlorosilane, a monoalkoxysilane, a dialkoxysilane, and a trialkoxysilane links the substrate and the spacer moiety, and wherein the NDR device exhibits negative differential resistance in the presence of a voltage; and
(b) applying a varying voltage to the NDR device provided in step (a), whereby a negative differential resistance is generated.

51. The method of claim 50, wherein the conductor material is selected from the group consisting of gold, silver, copper, nickel, platinum, palladium, indium tin oxide and yttrium-barium-copper oxide.

52. The method of claim 51, wherein the semiconductor material is selected from the group consisting of silicon, germanium, a III-V semiconductor, and a II-VI semiconductor.

53. The method of claim 51, wherein the electroactive moiety is selected from the group consisting of ferrocene; galvinol; an electroactive coordination compound of copper (I), copper (II) or combinations thereof; an electroactive coordination compound of iron (II), iron (III) or combinations thereof; viologen and its derivatives; a quinine; an anthroquinone; a cyanine; a porphyrin; a meso-substituted porphyrin; a beta-substituted porphyrin; a multi porphyrin array; a bipyridyl complex of ruthenium, osmium, iron, cobalt, and nickel, or combinations thereof; a phenanthroline complex of ruthenium, osmium, iron, cobalt, nickel or combinations thereof; a cyanide complex of iron, molybdenum, iridium, cobalt or combinations thereof; and a salen complex of manganese, nickel, cobalt, or combinations thereof.

54. The method of claim 51, wherein the spacer moiety is a branched or straight chain alkyl of 1-20 carbon atoms, a branched or straight chain alkenyl of 1-20 carbon atoms, a branched or straight chain alkynyl of 1-20 carbon atoms, and substituted versions thereof.

55. The method of claim 50, wherein the SAM further comprises a second linker moiety that links the electroactive moiety to the spacer moiety.

56. The method of claim 55, wherein the first and second linkers are the same.

57. The method of claim 55, wherein the second linker is selected from the group consisting of a thiol, an isocyanide, a carboxylic acid, a sulfonic acid, a phosphonic acid, a hydroxamic acid, an alcohol, an amine, a monochlorosilane, a dichlorosilane, a trichlorosilane, a monoalkoxysilane, a dialkoxysilane, and a trialkoxysilane.

58. The method of claim 50, wherein the electroactive moiety is distributed within the SAM in a predetermined pattern.

59. The method of claim 50, wherein the SAM further comprises a second electroactive moiety, the second electroactive moiety having a different NDR characteristic from the first electroactive moiety.

60. The method of claim 59, wherein the first and second electroactive moieties are distributed within the SAM in a predetermined pattern.

61. The method of claim 50, wherein the SAM further comprises one or more additional electroactive moieties and one or more additional spacer moieties, wherein the electroactive moieties and the spacer moieties are the same or different, and wherein the one or more additional spacer moieties interconnect the one or more additional electroactive moieties to the first electroactive moiety and to themselves to provide a multilayered SAM.

62. The method of claim 61, further comprising a linker moiety that interconnects the spacer moieties and electroactive moieties.

63. The method of either of claims 50 or 61, wherein the NDR device exhibits two or more negative differential resistance peaks in the presence of a varying applied voltage.

64. The method of claim 61, wherein the NDR device displays a NDR peak to valley ratio associated with the number of layers in the multilayered SAM.

65. The method of either of claims 50 or 61, further comprising a second electrical contact comprising a semiconductor material or a conductor material, wherein the SAM is disposed between the substrate and the second electrical contact.

66. The method of claim 65, further comprising modulating NDR in the NDR device by disposing a spacer moiety on the second electrical contact.

67. The method of claim 66, wherein the spacer moiety is an alkane thiol.

68. The method of claim 65, wherein the second electrical contact is a metal contact.

69. The method of claim 65, wherein the second electrical contact is one of a metallic proximal probe and a semi-conducting proximal probe.

70. The method of claim 65, wherein the second electrical contact comprises an evaporated top contact.

71. The method of claim 50, further comprising modulating the NDR by contacting the electroactive moiety in the NDR device with a modulating moiety.

72. The method of claim 71, wherein the contact comprises contacting the NDR device with a solution comprising the modulator moiety.

73. A memory cell comprising a NDR device of claim 1; and a switching component.

74. A NDR device comprising:
(a) a substrate comprising a conductor material or a semiconductor material;
(b) a self-assembled monolayer (SAM) disposed on the substrate, wherein the SAM comprises a first electroactive moiety, a linker moiety, and a spacer moiety, the spacer moiety interposed between and defining a tunnel barrier between the electroactive moiety and the substrate and the linker moiety linking the substrate and the spacer moiety, wherein the linker moiety is selected from the group consisting of a thiol, an isocyanide, a carboxylic acid, a sulfonic acid, a phosphonic acid, a hydroxamic acid, an alcohol, an amine, a monochlorosilane, a dichlorosilane, a trichlorosilane, a monoalkoxysilane, a dialkoxysilane, and a trialkoxysilane; and
(c) a second electrical contact comprising a conductor material or a semiconductor material, wherein the substrate and the second electrical contact define a break junction,
(d) wherein the NDR device exhibits negative differential resistance in the presence of a varying applied voltage and the SAM is sandwiched into the break junction.

75. A NDR device comprising:
(a) a substrate comprising a conductor material or a semiconductor material, the substrate defining a first structure comprising one of a nanotube, a nanowire, and both nanotube and nanowire;
(b) a self-assembled monolayer (SAM) disposed on the substrate, wherein the SAM comprises a first electroactive moiety, a linker moiety, and a spacer moiety, the spacer moiety interposed between and defining a tunnel barrier between the electroactive moiety and the substrate and the linker moiety linking the substrate and the spacer moiety, wherein the linker moiety is selected from the group consisting of a thiol, an isocyanide, a carboxylic acid, a sulfonic acid, a phosphonic acid, a hydroxamic acid, an alcohol, an amine, a monochlorosilane, a dichlorosilane, a trichlorosilane, a monoalkoxysilane, a dialkoxysilane, and a trialkoxysilane; and
(c) a second electrical contact comprising a semiconductor material or a conductor material, the second electrical contact defining a second structure comprising one of a nanotube, a nanowire, and both nanotube and nanowire,
(d) wherein the NDR device exhibits negative differential resistance in the presence of a varying applied voltage and wherein the SAM is disposed between the first and second structures.

76. The NDR device of claim 75, wherein the SAM is disposed between the first and second structures in a crossed array.

77. The method of claim 38, wherein the second electroactive moiety replaces the first electroactive moiety in a localized desorption region upon application of varying voltage.

78. The method of claim 77, wherein at least one of the electroactive moieties is a thiol.

79. The method of claim 78, wherein the first electroactive moiety is a ferrocene-terminated thiol.

80. The NDR device of claim 1, wherein the spacer moiety and the linker moiety together are a chemical moiety selected from the group consisting of alkylthiol, alkylisocyanide, alkylcarboxylic acid, alkylsulfonic acid, alkylphosphonic acid, alkylhydroxamic acid, alkylalcohol, alkylamine, alkylmonochlorosilane, alkyldichlorosilane, alkyltrichlorosilane, alkylmonoalkyoxysilane, alkyldialkoxysilane, and alkyltrialkoxysilane, wherein the alkyl portion of the chemical moiety is a branched or straight chain alkyl of 1-20 carbon atoms.

81. The method of claim 29, wherein the spacer moiety and the linker moiety together are a chemical moiety selected from the group consisting of alkylthiol, alkylisocyanide, alkylcarboxylic acid, alkylsulfonic acid, alkylphosphonic acid, alkylhydroxamic acid, alkylalcohol, alkylamine, alkylmonochlorosilane, alkyldichlorosilane, alkyltrichlorosilane, alkylmonoalkyoxysilane, alkyldialkoxysilane, and alkyltrialkoxysilane, wherein the alkyl portion of the chemical moiety is a branched or straight chain alkyl of 1-20 carbon atoms.

82. The method of claim 50, wherein the spacer moiety and the linker moiety together are a chemical moiety selected from the group consisting of alkyithiol, alkylisocyanide, alkylcarboxylic acid, alkylsulfonic acid, alkylphosphonic acid, alkylhydroxamic acid, alkylalcohol, alkylamine, alkylmonochlorosilane, alkyldichlorosilane, alkyltrichlorosilane, alkylmonoalkyoxysilane, alkyldialkoxysilane, and alkyltrialkoxysilane, wherein the alkyl portion of the chemical moiety is a branched or straight chain alkyl of 1-20 carbon atoms.

83. The NDR device of claim 74, wherein the spacer moiety and the linker moiety together are a chemical moiety selected from the group consisting of alkylthiol, alkylisocyanide, alkylcarboxylic acid, alkylsulfonic acid, alkylphosphonic acid, alkylhydroxamic acid, alkylalcohol, alkylamine, alkylmonochlorosilane, alkyldichlorosilane, alkyltrichlorosilane, alkylmonoalkyoxysilane, alkyldialkoxysilane, and alkyltrialkoxysilane, wherein the alkyl portion of the chemical moiety is a branched or straight chain alkyl of 1-20 carbon atoms.

84. The NDR device of claim 75, wherein the spacer moiety and the linker moiety together are a chemical moiety selected from the group consisting of alkylthiol, alkylisocyanide, alkylcarboxylic acid, alkylsulfonic acid, alkylphosphonic acid, alkylhydroxamic acid, alkylalcohol, alkylamine, alkylmonochlorosilane, alkyldichlorosilane, alkyltrichlorosilane, alkylmonoalkyoxysilane, alkyldialkoxysilane, and alkyltrialkoxysilane, wherein the alkyl portion of the chemical moiety is a branched or straight chain alkyl of 1-20 carbon atoms.

* * * * *